(12) United States Patent
Banba et al.

(10) Patent No.: US 7,361,445 B2
(45) Date of Patent: Apr. 22, 2008

(54) POSITIVE-WORKING PHOTOSENSITIVE RESIN COMPOSITION, METHOD FOR PRODUCING PATTERN-FORMED RESIN FILM, SEMICONDUCTOR DEVICE, DISPLAY DEVICE, AND METHOD FOR PRODUCING THE SEMICONDUCTOR DEVICE AND THE DISPLAY DEVICE

(75) Inventors: Toshio Banba, Tokyo (JP); Takuji Ikeda, Tokyo (JP); Tatsuya Yano, Tokyo (JP); Takashi Hirano, Tokyo (JP)

(73) Assignee: Sumitomo Bakelite Company, Tokyo (JP)

( * ) Notice: Subject to any disclaimer, the term of this patent is extended or adjusted under 35 U.S.C. 154(b) by 99 days.

(21) Appl. No.: 11/175,813

(22) Filed: Jul. 6, 2005

(65) Prior Publication Data
US 2005/0266334 A1    Dec. 1, 2005

Related U.S. Application Data

(62) Division of application No. 10/874,592, filed on Jun. 23, 2004.

(30) Foreign Application Priority Data

Jun. 23, 2003  (JP) .............................. 2003-178408
Oct. 28, 2003  (JP) .............................. 2003-367316

(51) Int. Cl.
  *G03F 7/023*  (2006.01)
  *G03F 7/30*   (2006.01)
(52) U.S. Cl. ................. 430/191; 430/18; 430/192; 430/193; 430/326; 430/330
(58) Field of Classification Search ............... 430/7, 430/18, 28, 191, 192, 193, 326, 330
See application file for complete search history.

(56) References Cited

U.S. PATENT DOCUMENTS

| 4,339,521 | A | 7/1982 | Ahne |
| 4,880,722 | A | 11/1989 | Moreau |
| 5,229,246 | A | 7/1993 | Shibata |
| 5,275,910 | A * | 1/1994 | Moriuma et al. ........... 430/191 |
| 5,624,781 | A | 4/1997 | Naruse |
| 6,274,287 | B1 * | 8/2001 | Moriuma et al. ......... 430/270.1 |
| 6,383,709 | B2 * | 5/2002 | Uetani et al. ................ 430/191 |
| 6,518,390 | B2 * | 2/2003 | Okanuma et al. ........... 528/176 |
| 2005/0202337 | A1 * | 9/2005 | Miyoshi et al. .......... 430/270.1 |

FOREIGN PATENT DOCUMENTS

| EP | 0 212 482 A2 | 3/1987 |
| EP | 0 807 852 A1 | 11/1997 |
| EP | 1 195 811 A1 | 4/2002 |
| JP | 62-251740 | 11/1987 |
| JP | 1-46862 | 10/1989 |
| JP | 2004-54254 A * | 2/2004 |

* cited by examiner

Primary Examiner—John S. Chu
(74) Attorney, Agent, or Firm—Smith, Gambrell & Russell

(57) ABSTRACT

A positive-working photosensitive resin composition containing an alkali soluble resin (A), a diazoquinone compound (B) and a compound (C) which contains a —$CH_2OH$ group but not a phenolic hydroxyl group, a method for producing a pattern-formed resin film using the composition, a semiconductor device and a display device using the composition, and a method for producing the semiconductor device and the display device. Also, disclosed is a positive-working photosensitive resin composition containing an alkali soluble resin (A), a diazoquinone compound (B) and a mixture solvent of two or more kinds (D), wherein the mixture solvent (D) contains γ-butyrolactone and propylene glycol monoalkyl ether and the total amount of γ-butyrolactone and propylene glycol monoalkyl ether is about 70 wt % or more of the total amount of solvent, a method for producing a pattern-formed resin film using the composition, a semiconductor device and a display device using the composition, and a method for producing the semiconductor device and the display device.

10 Claims, 2 Drawing Sheets

POSITIVE-WORKING PHOTOSENSITIVE RESIN COMPOSITION, METHOD FOR PRODUCING PATTERN-FORMED RESIN FILM, SEMICONDUCTOR DEVICE, DISPLAY DEVICE, AND METHOD FOR PRODUCING THE SEMICONDUCTOR DEVICE AND THE DISPLAY DEVICE

CROSS-REFERENCE TO RELATED APPLICATIONS

This application is a division of U.S. patent application Ser. No. 10/874,592 filed Jun. 23, 2004 and based on Japanese Application No. 2003-178408, filed in the Japanese Patent Office on Jun. 23, 2003, and Japanese Application No. 2003-367316, filed in the Japanese Patent Office on Oct. 28, 2003, which disclosures are incorporated herein by reference.

BACKGROUND OF THE INVENTION

1. Field of the Invention

The present invention relates to a positive-working photosensitive resin composition, a method for producing a pattern-formed resin film using the composition, a semiconductor device and a display device using the composition, and a method for producing the semiconductor device and the display device.

2. Description of the Related Art

A polyimide resin having high heat resistance, excellent electrical and mechanical properties or the like was conventionally used for a surface protective film or an interlayer insulation film of a semiconductor element. However, a resin of further improved performance has been lately required to satisfy the requirement for marked improvement in properties such as resistance against repeated heat or thermal shock due to higher integration and larger scale of a semiconductor element, thinning and down-sizing of a semiconductor device, shift to surface mounting by reflow of solder or the like.

On the other hand, there is a technology to give photosensitivity to a polyimide resin itself, for instance, a photosensitive polyimide resin represented by the formula (2) below.

Therefore, a positive-working photosensitive resin that can be developed by an alkaline aqueous solution has been lately exploited. For instance, a positive-working photosensitive resin comprising a polybenzoxazole precursor as a base polymer and a diazoquinone compound as a photosensitive material has been disclosed in JP-B-1-46862. This resin has high heat resistance, superior electrical properties and fine processability, and a potential of resin not only for wafer coating but also for interlayer insulation. With regard to a development mechanism of this positive-working photosensitive resin, a diazoquinone compound in an exposed area is subjected to a chemical change to become soluble in an alkaline aqueous solution, while the diazoquinone compound in an unexposed area remains insoluble in the aqueous solution of the alkali. Utilizing the difference of solubility between the exposed area and the unexposed area, a pattern of coating film only in the unexposed area can be obtained by dissolving and removing the resin in the exposed area.

SUMMARY OF THE INVENTION

In use of these photosensitive resin compositions, sensitivity of the photosensitive resin compositions is especially of significance. Low sensitivity requires a longer exposure time resulting in a lower throughput. In order to improve the sensitivity of a photosensitive resin compositions, for instance, more photosensitive agent or the like is added, it may result in generation of a development residue called scum at an end portion of a pattern after development, while the sensitivity improves.

Also, coloring after curing of these photosensitive resins, which are heated and cured after pattern processing, often becomes a problem. If coloring is thick, there may be problems such as lowering visibility and incapability of assembling of a semiconductor device.

Further, water absorption coefficient of a film after curing these photosensitive resin compositions is also important. In a reliability evaluation of a semiconductor, a semiconductor is tested under high temperature and humidity. If a film is used for a surface protective film or an interlayer insulation film of a semiconductor, the film after curing these photo-

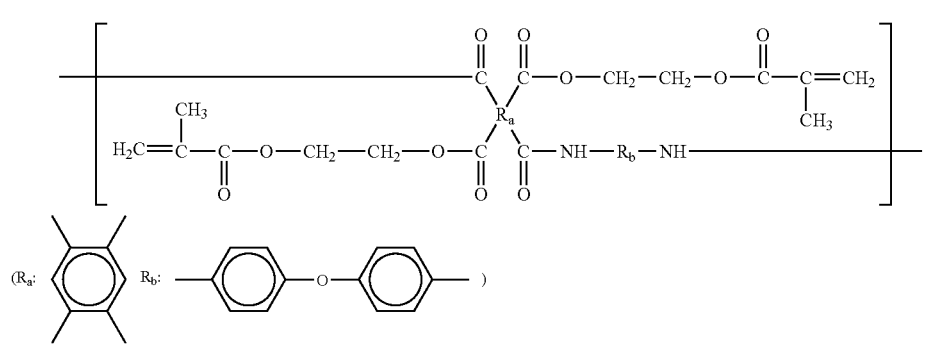

(2)

Using the above polyimide resin poses a problem in safety and handling due to necessity of spraying a solvent such as N-methyl-2-pyrrolidone or the like in development, while a part of procedures to make a pattern can be simplified resulting in shorter process and improved yield.

sensitive resins needs to show low water absorption properties enough for these films.

These photosensitive resins are subject to patterning on a silicon wafer. Lately, as diameter of wafer becomes larger, the importance of uniformity in film thickness grows. The uniformity in film thickness after coating is important, however, the uniformity in film thickness after development is particularly important.

In light of these problems, a first object of the present invention is to provide a positive-working photosensitive resin composition which has high sensitivity and is capable of patterning without scum, a method for producing a pattern-formed resin film using the composition, a semiconductor device and a display device using the composition, and a method for producing the semiconductor device and the display device.

A second object of the present invention is to provide a positive-working photosensitive resin composition wherein the composition has high sensitivity and is capable of patterning without scum and a film of the composition after curing has low coloring and low water absorption properties, a method for producing a pattern-formed resin film using the composition, a semiconductor device and a display device using the composition, and a method for producing the semiconductor device and the display device.

A third object of the present invention is to provide a positive-working photosensitive resin composition which has high sensitivity, is capable of patterning without scum and is excellent in uniformity in film thickness, a method for producing a pattern-formed resin film using the composition, a semiconductor device and a display device using the composition, and a method for producing the semiconductor device and the display device.

A first aspect of the present invention provides a positive-working photosensitive resin composition comprising an alkali soluble resin (A), a diazoquinone compound (B) and a compound (C) which contains a —CH2OH group but not a phenolic hydroxyl group, a method for producing a pattern-formed resin film using the composition, a semiconductor device and a display device using the composition, and a method for producing the semiconductor device and the display device.

The first aspect of the present invention can attain the first and second objects of the present invention.

The method for producing a pattern-formed resin film of the first aspect is comprising steps of: forming a composition layer by coating a positive-working photosensitive resin composition of the above-mentioned first aspect on a substrate; forming a pattern by allowing the composition layer to be irradiated with an active energy ray and be in contact with a developing solution; and heating the composition.

The semiconductor device and the display device of the first aspect are produced by using a positive-working photosensitive resin composition of the above-mentioned first aspect.

The method for producing a semiconductor device and a display device of the first aspect is comprising steps of coating a positive-working photosensitive resin composition of the above-mentioned first aspect on a semiconductor element or a substrate for display device so that the film thickness of the composition after curing becomes 0.1 to 50 μm followed by prebaking, exposuring, developing and heating.

A second aspect of the present invention provides a positive-working photosensitive resin composition comprising an alkali soluble resin (A), a diazoquinone compound (B) and a mixture solvent of two or more kinds (D), wherein the mixture solvent (D) contains γ-butyrolactone and propylene glycol monoalkyl ether and the total amount of γ-butyrolactone and propylene glycol monoalkyl ether is 70 wt % or more of the total amount of solvent, a method for producing a pattern-formed resin film using the composition, a semiconductor device and a display device using the composition, and a method for producing the semiconductor device and the display device.

The second aspect of the present invention can attain the first and third objects of the present invention.

The method for producing a pattern-formed resin film of the second aspect is comprising steps of: forming a composition layer by coating a positive-working photosensitive resin composition of the above-mentioned second aspect on a substrate; forming a pattern by allowing the composition layer to be irradiated with an active energy ray and be in contact with a developing solution; and heating the composition.

The semiconductor device and the display device of the second aspect are produced by using a positive-working photosensitive resin composition of the above-mentioned second aspect.

The method for producing a semiconductor device and a display device of the second aspect is comprising steps of coating a positive-working photosensitive resin composition of the above-mentioned second aspect on a semiconductor element or a substrate for display device so that the film thickness of the composition after curing becomes 0.1 to 50 μm followed by prebaking, exposuring, developing and heating.

Figure 1:
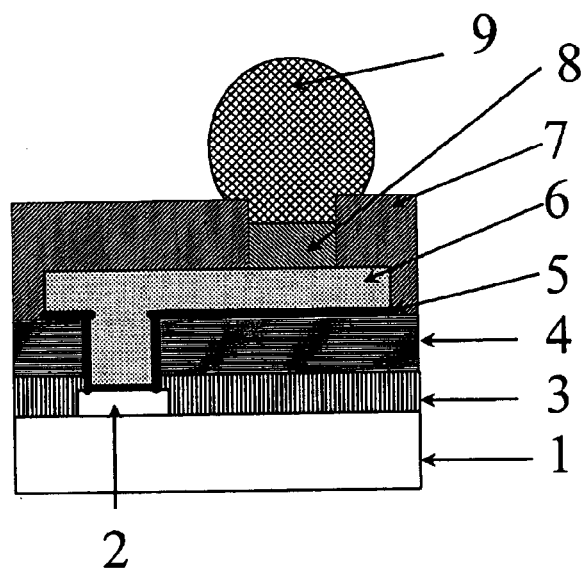
FIG. 1 is an enlarged cross-sectional view showing a pad portion of a semiconductor device having a bump of the present invention.

The sign in each figure refers to the following: a silicon wafer (1), an Al pad (2), a passivation film (3), a buffer coating film (4), a metal (Cr, Ti or the like) film (5), a wiring (Al, Cu or the like) (6), an insulation film (7), a barrier metal (8), a solder bump (9), a 8-inch wafer (11), a measured part (9 places) (12), a notch (13).

DETAILED DESCRIPTION OF THE INVENTION

An alkali soluble resin (A) used in the present invention is a resin having a hydroxyl group, a carboxyl group or a sulfonic acid group in principal chain or side chain. As the alkali soluble resin (A), there may be a resin having a polybenzoxazole structure, a polybenzoxazole precursor structure, a polyimide structure, a polyimide precursor structure or a polyamic ester structure and having a hydroxyl group, a carboxyl group or a sulfonic acid group in principal chain or side chain, a cresol novolak resin, a polyhydroxy styrene or the like. Among them, a resin containing one or more structures selected from a polybenzoxazole structure, a polybenzoxazole precursor structure, a polyimide structure, a polyimide precursor structure and a polyamic ester structure is preferable. Particularly, a polyamide resin containing a structure represented by the formula (1) is preferable in terms of heat resistance after final heating:

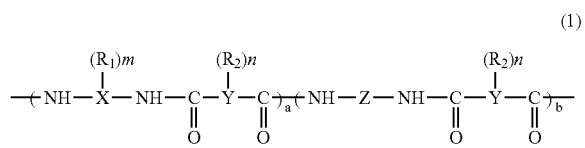

(1)

wherein, X is an organic group of 2 to 4 valences; Y is an organic group of 2 to 6 valences; $R_1$ is a hydroxyl group or —O—$R_3$ each of which may be the same or different from each other wherein m is an integer of 0 to 2; $R_2$ is a hydroxyl group, a carboxyl group, —O—$R_3$ or —COO—$R_3$ each of which may be the same or different from each other wherein n is an integer of 0 to 4; $R_3$ is an organic group having 1 to 15 carbon atoms (If $R_1$ is not a hydroxyl group, at least one of $R_2$ is a carboxyl group. If $R_2$ is not a carboxyl group, at least one of $R_1$ is a hydroxyl group); Z is

Z:

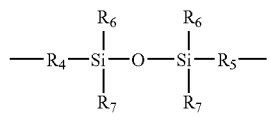

wherein each of $R_4$ and $R_5$ is a divalent organic group and each of $R_6$ and $R_7$ is a monovalent organic group each of which may be the same or different from each other; each of a and b represents a molar fraction; a+b=100% by mole, a=60 to 100% by mole and b=0 to 40% by mole.

X in polyamide resin containing the structure represented by the formula (1) represents an organic group of 2 to 4 valences wherein $R_1$ is a hydroxyl group or —O—$R_3$ each of which may be the same or different from each other and m is an integer of 0 to 2. Y in the formula (1) represents an organic group of 2 to 6 valences wherein $R_2$ is a hydroxyl group, a carboxyl group, —O—$R_3$ or —COO—$R_3$ each of which may be the same or different from each other and n is an integer of 0 to 4. $R_3$ is an organic group having 1 to 15 carbon atoms. If $R_1$ is not a hydroxyl group, at least one of $R_2$ is a carboxyl group. If $R_2$ is not a carboxyl group, at least one of $R_1$ is a hydroxyl group.

The polyamide resin containing the structure represented by the formula (1) is obtained by reacting a compound selected from a diamine, a bis (aminophenol), 2,4-diaminophenol or the like having a structure of X, a silicone-diamine having a structure of Z which is compounded if necessary, and a compound selected from a tetracarboxylic anhydride, a trimellitic anhydride, a dicarboxylic acid, a dicarboxylic dichloride, a dicarboxylic acid derivative, a hydroxy dicarboxylic acid, a hydroxy dicarboxylic acid derivative or the like having a structure of Y. Incidentally, in the case of a dicarboxylic acid, an activated ester-type derivative of dicarboxylic acid reacted in advance with 1-hydroxy-1,2,3-benzotriazole or the like may be used so as to enhance a reaction yield or the like.

In the polyamide resin containing a structure represented by the formula (1), each of —O—$R_3$ as a substituent of X and —O—$R_3$ and —COO—$R_3$ as a substituent of Y may be a hydroxyl group or a carboxyl group protected by an organic group $R_3$ having 1 to 15 carbon atoms if required for the purpose of adjusting solubility of the hydroxyl group or the carboxyl group to an alkaline aqueous solution.

Examples of $R_3$ are a formyl group, a methyl group, an ethyl group, a propyl group, an isopropyl group, a tert-butyl group, a tert-butoxycarbonyl group, phenyl group, benzyl group, tetrahydrofuranyl group, tetrahydropyranyl group or the like.

The polyamide resin is dehydrated and cyclized by heating at about 250 to 400° C. to obtain a heat-resistant resin in a form of a polyimide, a polybenzoxazole or a copolymer of both polymers.

As X of the polyamide resin containing a structure represented by the formula (1) of the present invention, there may be examples as follows but may not be limited:

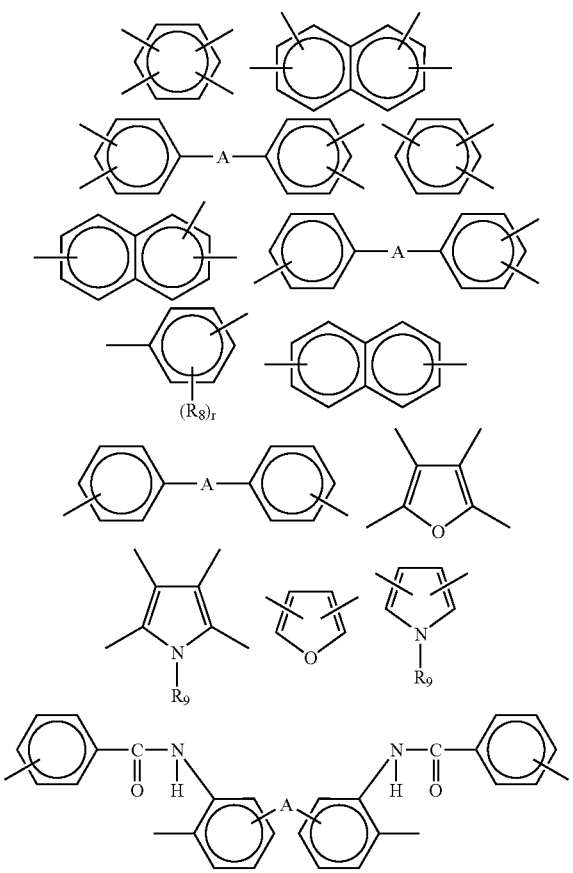

wherein, A is —$CH_2$—, —$C(CH_3)_2$—, —O—, —S—, —$SO_2$—, —CO—, —NHCO—, —$C(CF_3)_2$— or a single bond; each of $R_8$ is one group selected from an alkyl group, an alkyl ester group and a halogen atom, and may be the same or different from each other; r is an integer of 0 to 2; each of $R_9$ is one group selected from a hydrogen atom, an alkyl group, an alkyl ester group and a halogen atom. Particularly preferable X among these is selected from the following and two or more kinds of these may be used:

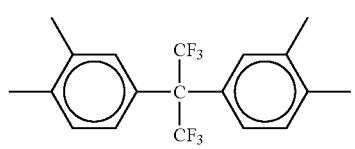

-continued

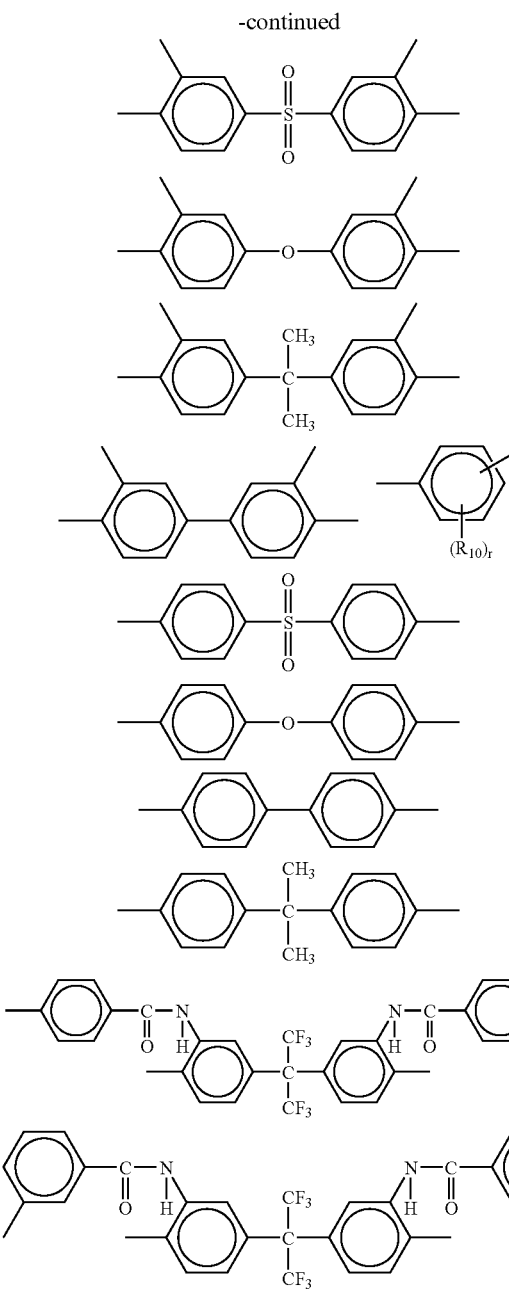

wherein, each of $R_{10}$ is one group selected from an alkyl group, an alkyl ester group and a halogen atom, and maybe the same or different from each other; r is an integer of 0 to 2.

As Y of the polyamide resin containing a structure represented by the formula (1), there may be examples as follows but may not be limited:

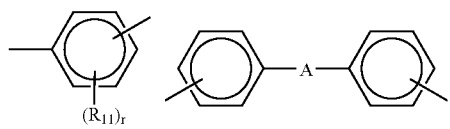

-continued

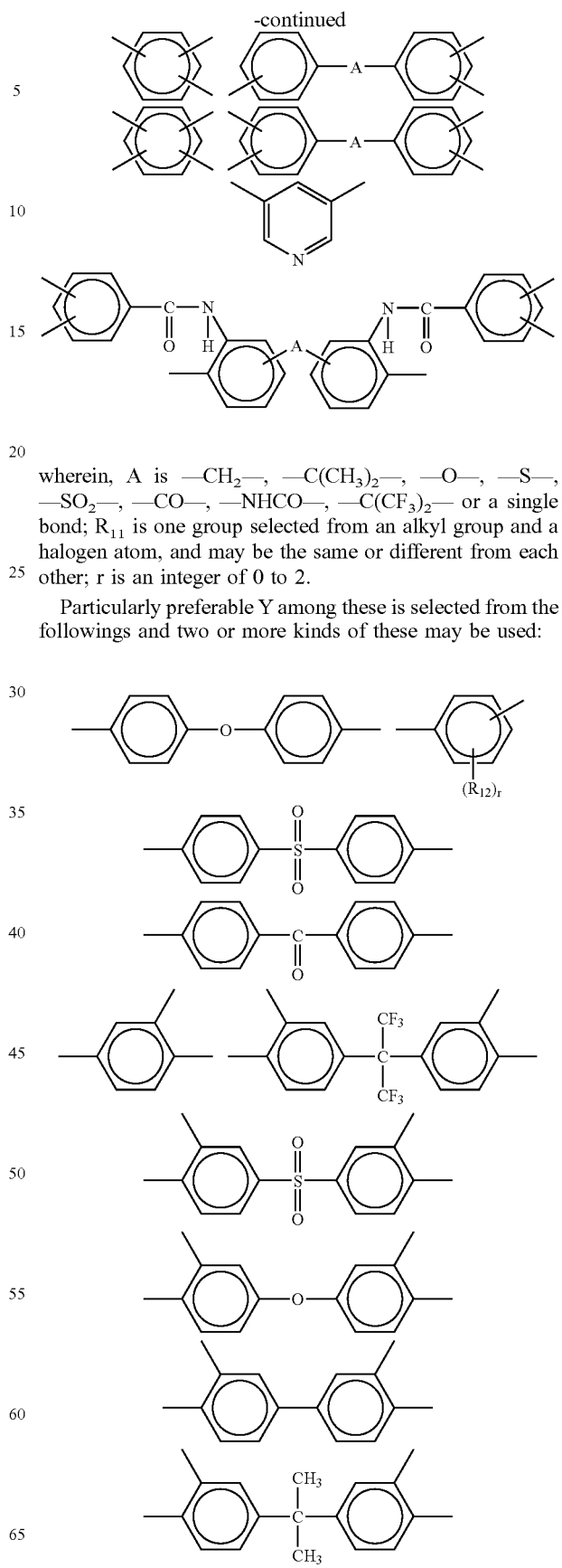

wherein, A is $-CH_2-$, $-C(CH_3)_2-$, $-O-$, $-S-$, $-SO_2-$, $-CO-$, $-NHCO-$, $-C(CF_3)_2-$ or a single bond; $R_{11}$ is one group selected from an alkyl group and a halogen atom, and may be the same or different from each other; r is an integer of 0 to 2.

Particularly preferable Y among these is selected from the followings and two or more kinds of these may be used:

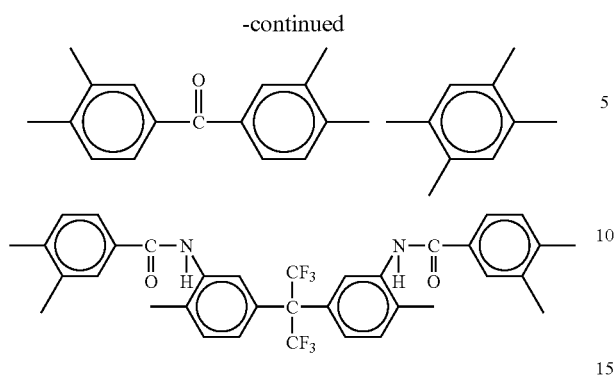

wherein, each of $R_{12}$ is one group selected from an alkyl group and a halogen atom, and may be the same or different from each other; r is an integer of 0 to 2.

In the present invention, from the viewpoint of storage stability of the positive-working photosensitive resin composition, it is desirable to cap a terminal. A terminal of a polyamide represented by the formula (1) may be capped by introducing a derivative containing an aliphatic group or a cyclic compound group having at least one of an alkenyl group or an alkynyl group as an acid derivative or an amine derivative. Specifically, for instance, after a polyamide resin containing a structure represented by the formula (1) is synthesized by reacting a compound selected from a diamine, a bis (aminophenol), 2,4-diaminophenol or the like having a structure of X, a silicone-diamine having a structure of Z which is added if necessary and a compound selected from a tetracarboxylic anhydride, a trimellitic anhydrate, a dicarboxylic acid, a dicarboxylic dichloride, a dicarboxylic acid derivative, a hydroxydicarbonic acid, a hydroxydicarbonic acid derivative or the like having a structure of Y, an amino group located at a terminal of the polyamide resin is preferably capped with an acid anhydride or an acid derivative containing an aliphatic group or a cyclic compound group having at least one of an alkenyl group or an alkynyl group so that an amide is obtained. Examples of a group which originates in an acid anhydride or an acid derivative containing an aliphatic group or a cyclic compound group having at least one of an alkenyl group or an alkynyl group after reaction with an amino group include the followings but may not be limited:

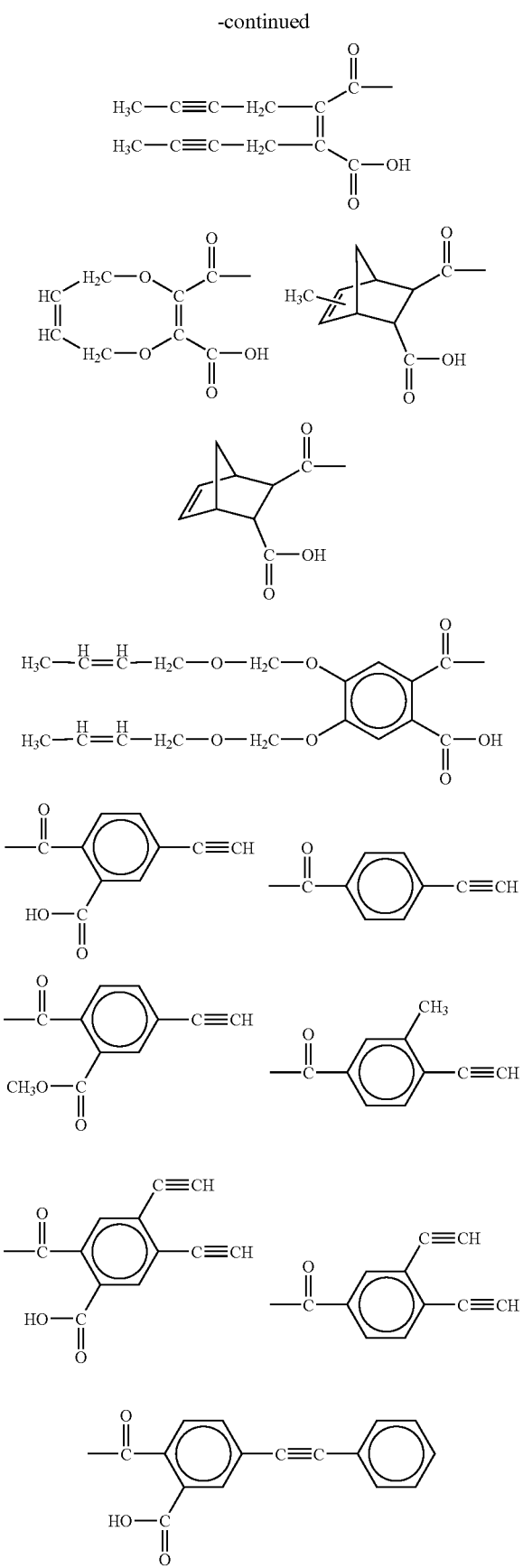

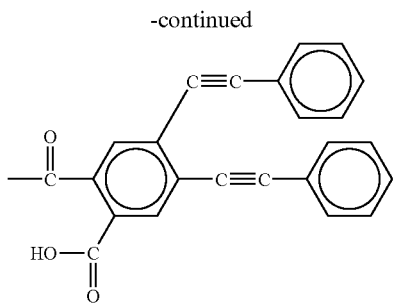

A particularly preferable group among these is selected from:

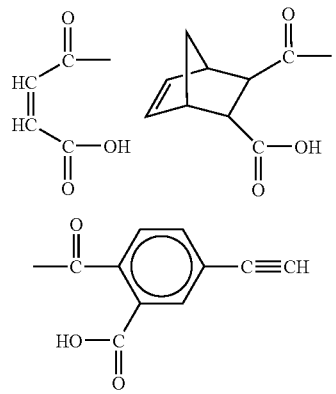

For a compound capping a terminal, two or more kinds of the above may be used. It is not limited to the above mentioned means, but an acid group located at a terminal of the polyamide resin can be capped with an amine derivative containing an aliphatic group or a cyclic compound group having at least one of an alkenyl group or an alkynyl group so that an amide is obtained.

Further, Z of the polyamide resin containing a structure represented by the formula (1) which is used if necessary includes the following, for instance, but may not be limited:

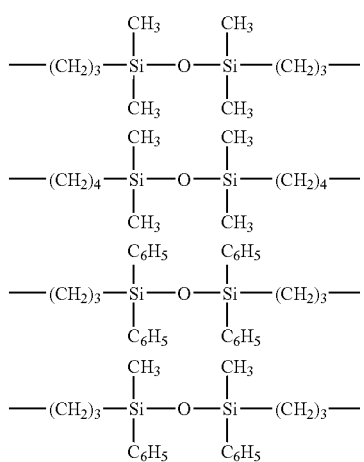

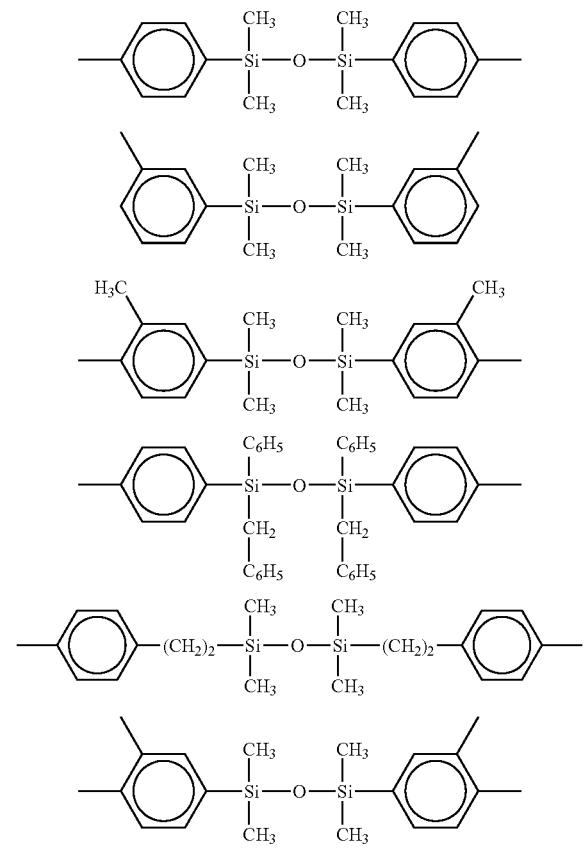

Among them, particularly preferable Z is selected from:

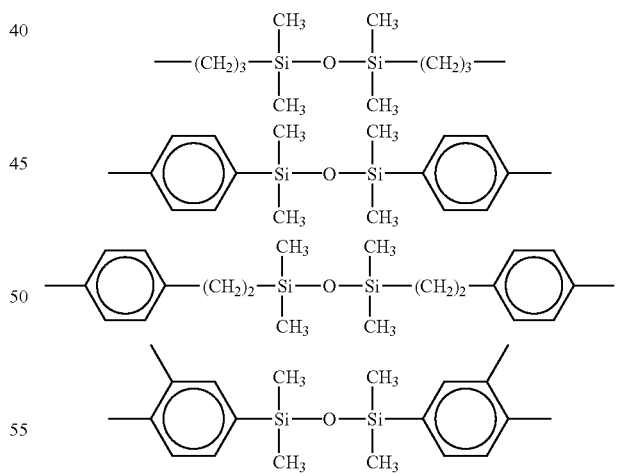

Also, as Z, two or more kinds may be used.

Z of the polyamide resin containing a structure represented by the formula (1) may be used when particularly superior adhesion to a substrate such as a silicon wafer is required. The fraction b of Z is at most 40% by mole preferably. If the fraction b exceeds 40% by mole, solubility of the resin may be badly decreased to generate a development residue (scum) making a pattern processing difficult.

The diazoquinone compound (B) used in the present invention is a compound having a 1,2-benzoquinonediazide or 1,2-naphthoquinonediazide structure and a well-known material disclosed by U.S. Pat. Nos. 2,772,975, 2,797,213 and 3,669,658. There may be, for instance:

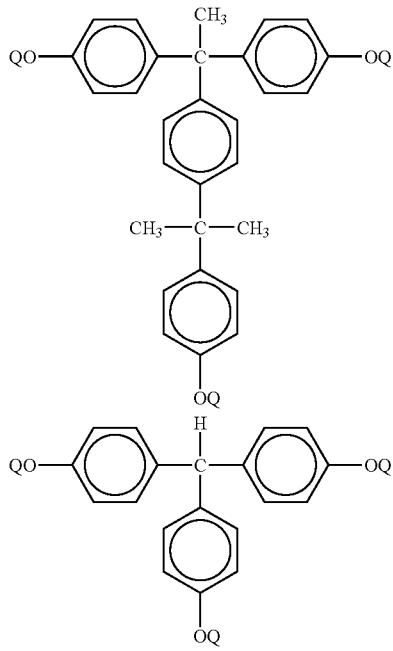

-continued

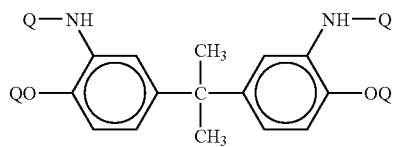

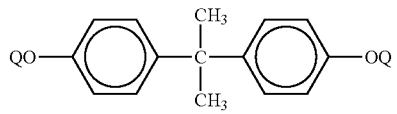

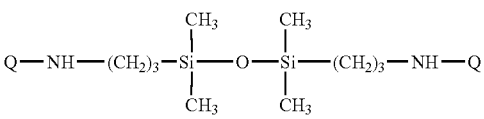

(In the formula, Q is hydrogen atom or selected from:

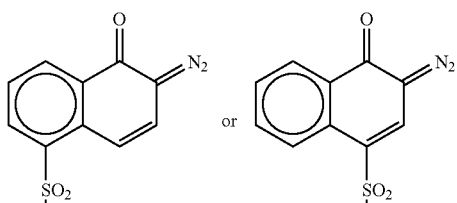

and in each compound at least one is:

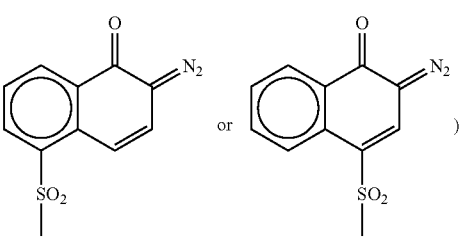

Among the abovementioned, particularly preferable diazoquinone compound (B) is an ester of phenol compound and 1,2-naphthoquinone-2-diazide-5-sulfonic acid or 1,2-naphtho quinone-2-diazide-4-sulfonic acid. There may be examples as follows but may not be limited and two or more kinds may be used:

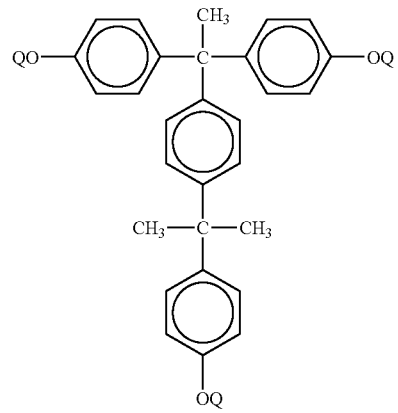
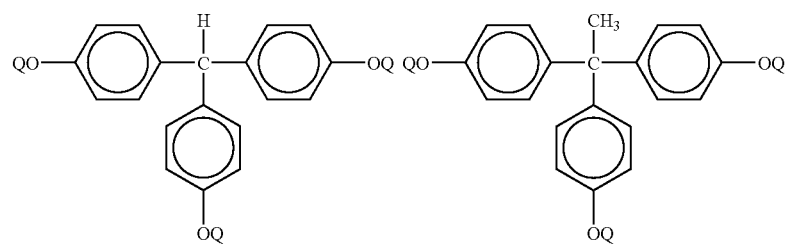
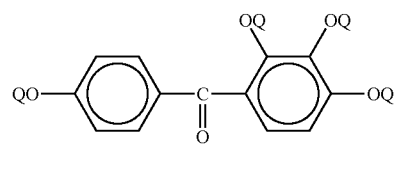
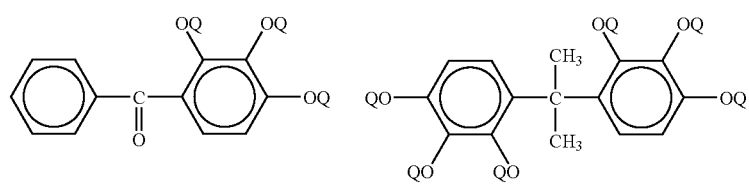
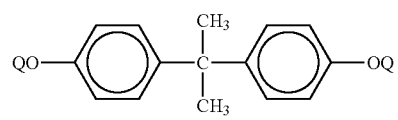
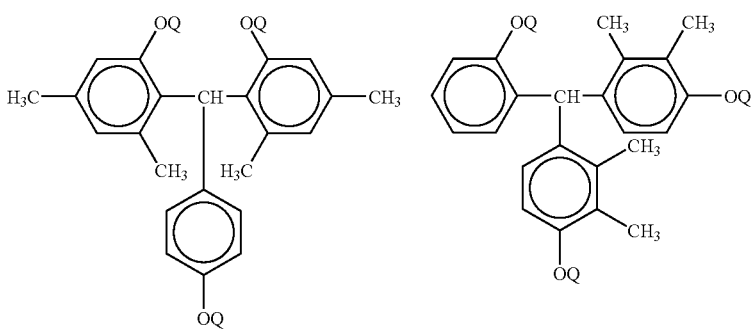
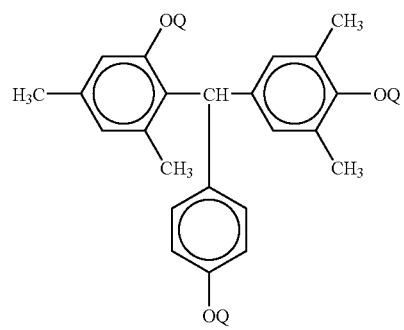
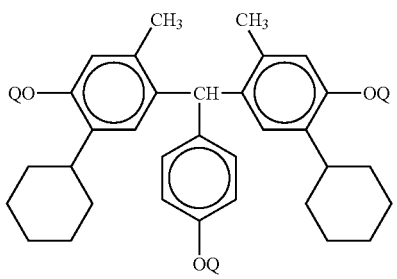
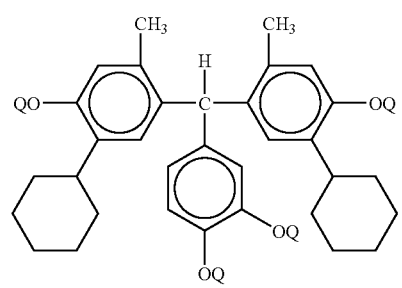
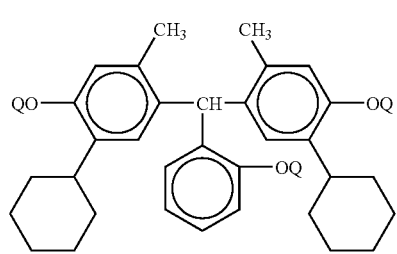

-continued
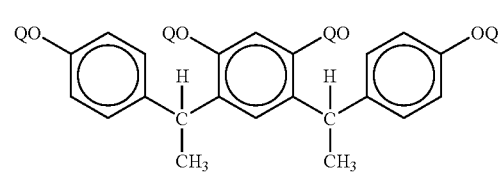
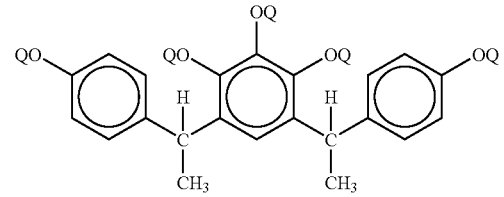
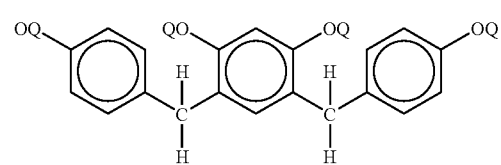
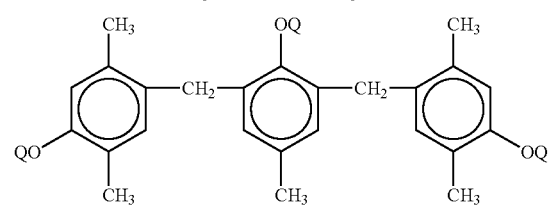
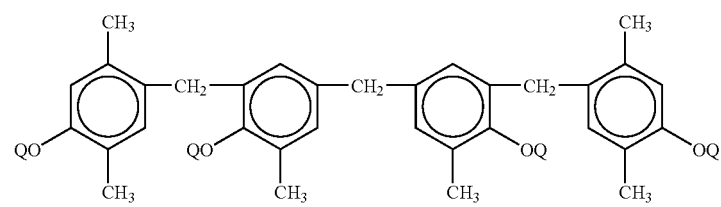
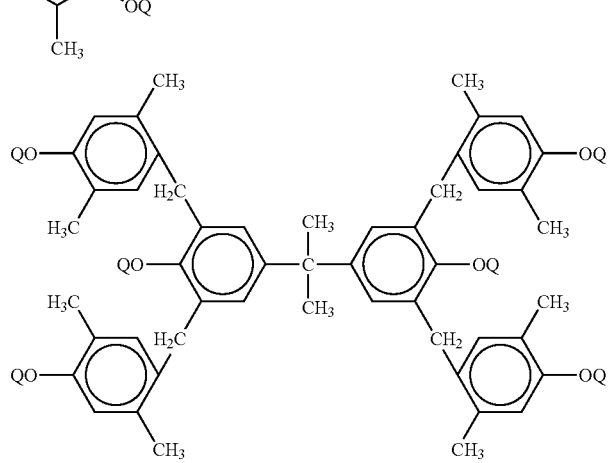
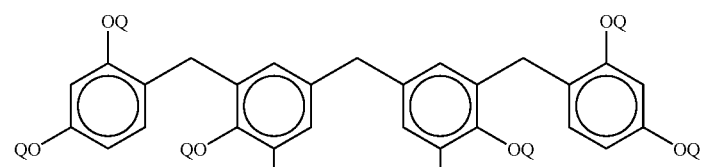
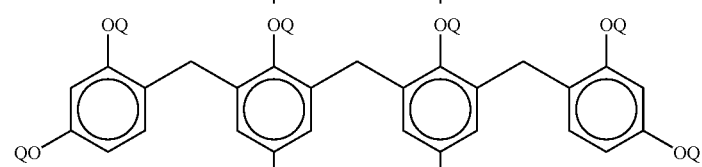
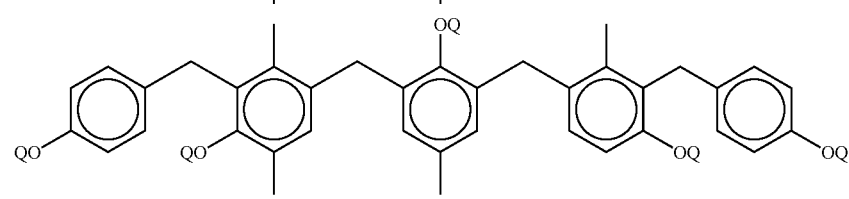
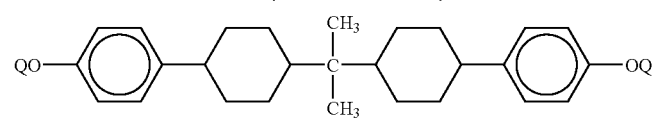

-continued
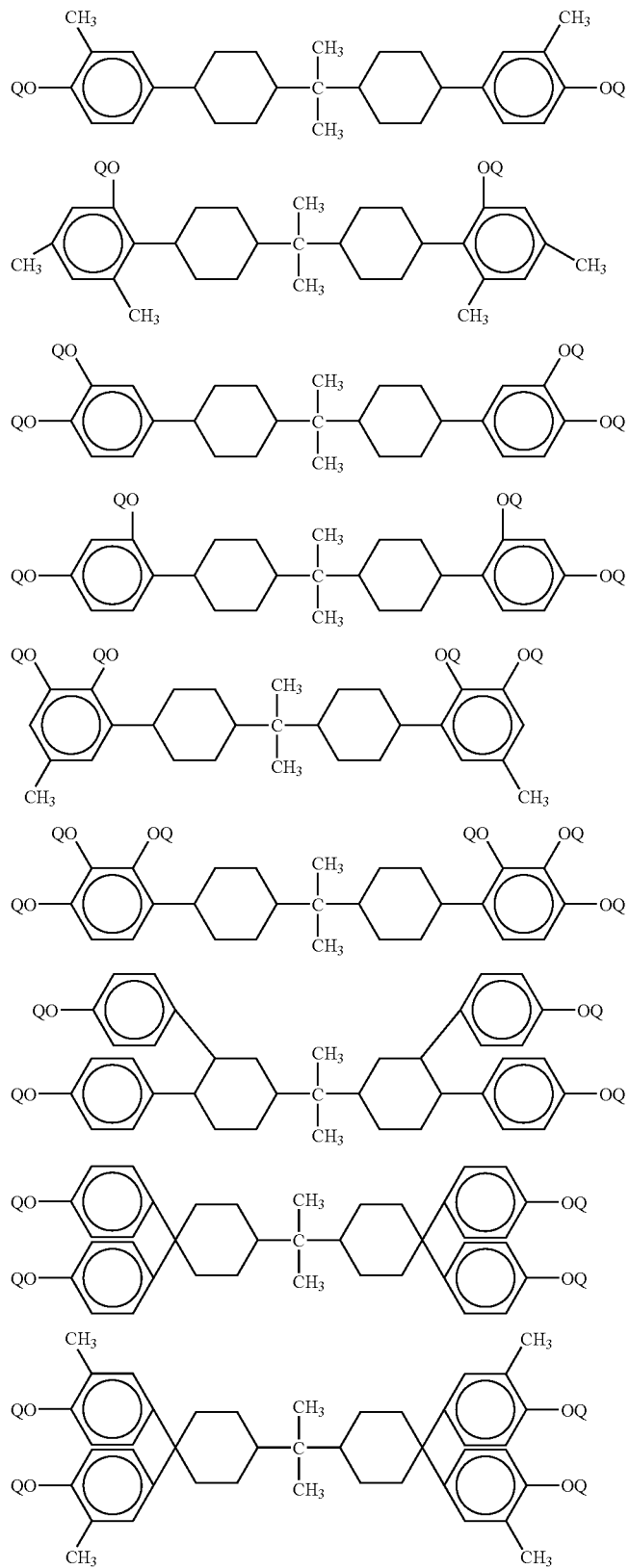

(In the formula, Q is hydrogen atom or selected from:

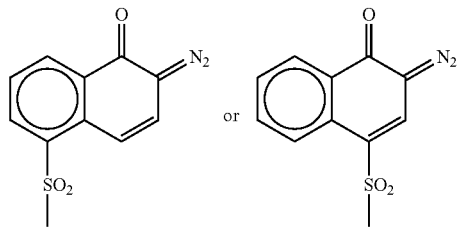

and in each compound at least one is:

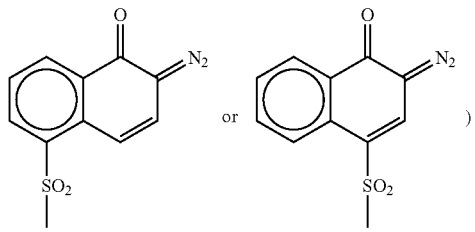

)

The compounding amount of the diazoquinone compound (B) of the present invention is preferably 1 to 50 parts by weight to 100 parts by weight of the alkali soluble resin (A). If the amount of the diazoquinone compound (B) lowers 1 part by weight, a favorable pattern cannot be obtained. If the amount thereof exceeds 50 parts by weight, sensitivity may decrease significantly.

The feature of the compound (C) containing a —$CH_2OH$ group used in the first aspect of the present invention is that it does not contain a phenolic hydroxyl group. By using the compound (C) which contains a —$CH_2OH$ group but not a phenolic hydroxyl group, a photosensitive resin composition wherein the composition has high sensitivity and is capable of patterning without scum and a film of the composition after curing has low coloring and low water absorption properties can be obtained.

The compound (C) preferably has an aromatic ring to which the —$CH_2OH$ group is directly bonded. As the aromatic ring, there may be an aromatic hydrocarbon such as benzene, naphthalene, anthracene or the like; and a heteroaromatic ring such as pyrrole, pyridine or the like. The above-mentioned compound (C) may have a structure in which aromatic rings are bonded each other such as biphenyl, terphenyl or the like, or a structure in which an aromatic ring is bonded to an organic group of divalent or more such as diphenylmethane or the like.

Also, the compound (C) is particularly preferable to have two or more —$CH_2OH$ groups.

As the compound (C) of the present invention, there may be examples as follows, wherein $R_{13}$ is a hydrogen atom, an alkyl group, an alkoxy group, a carboxyl group or an ester group, but may not be limited:

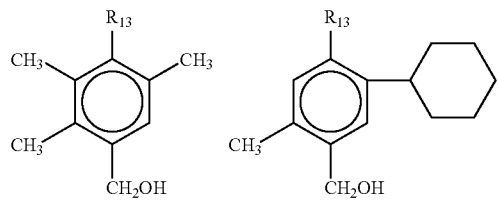

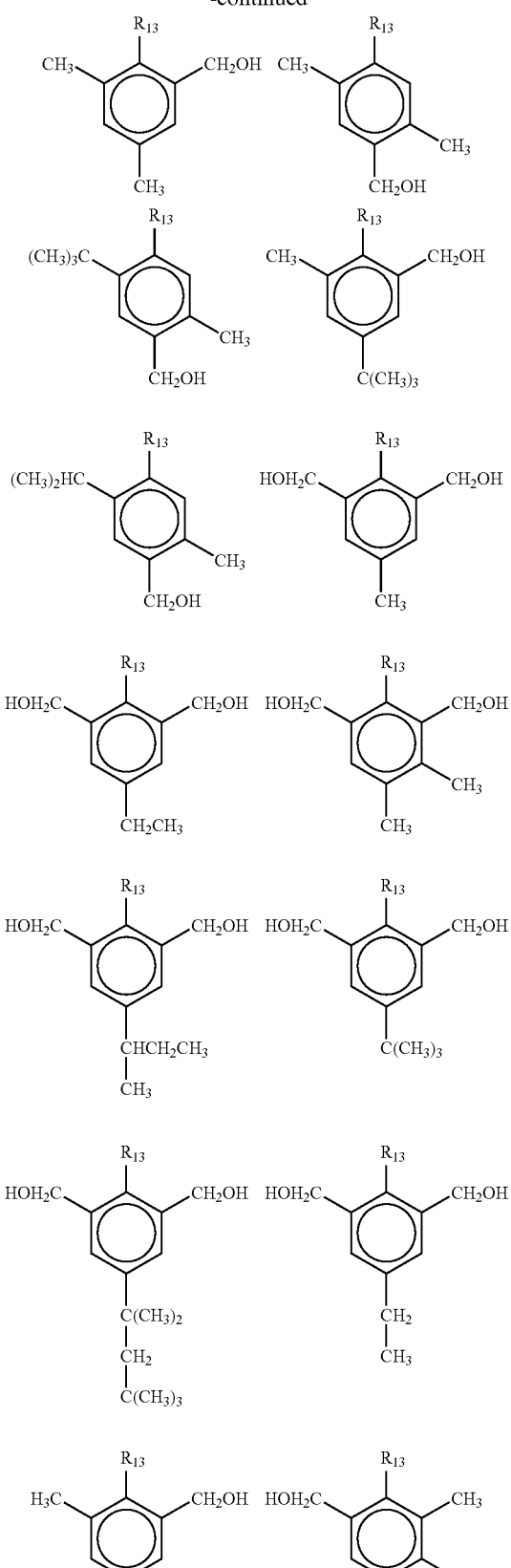

-continued
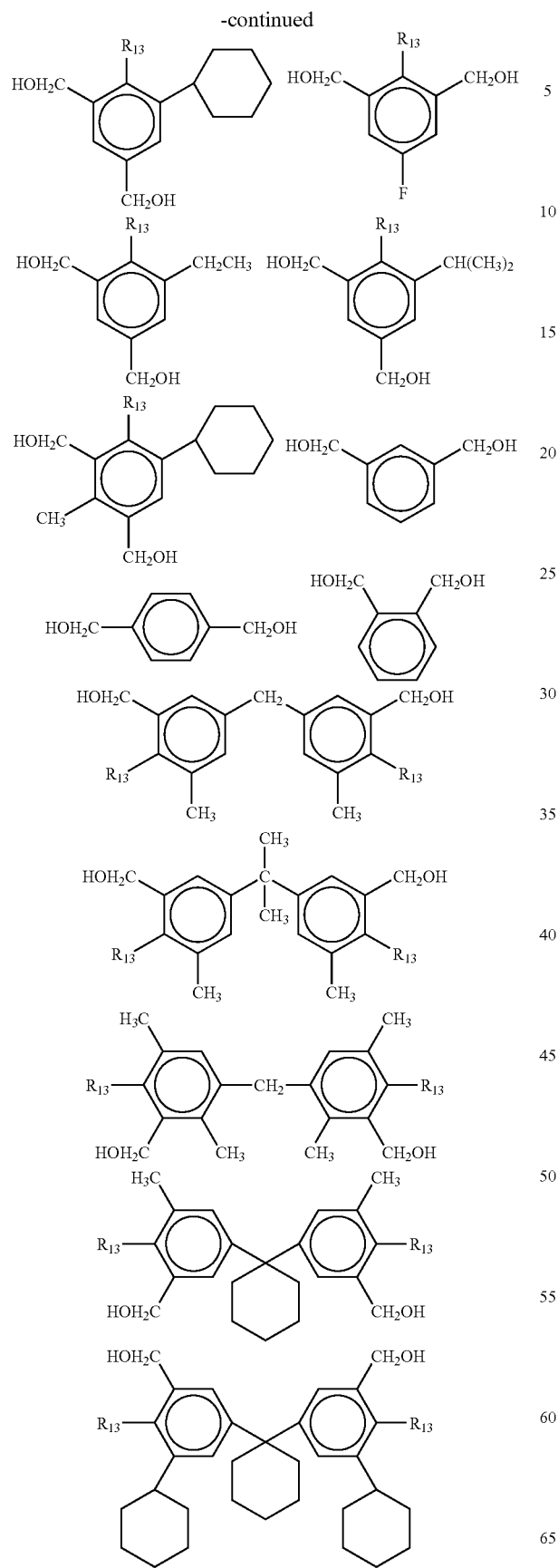
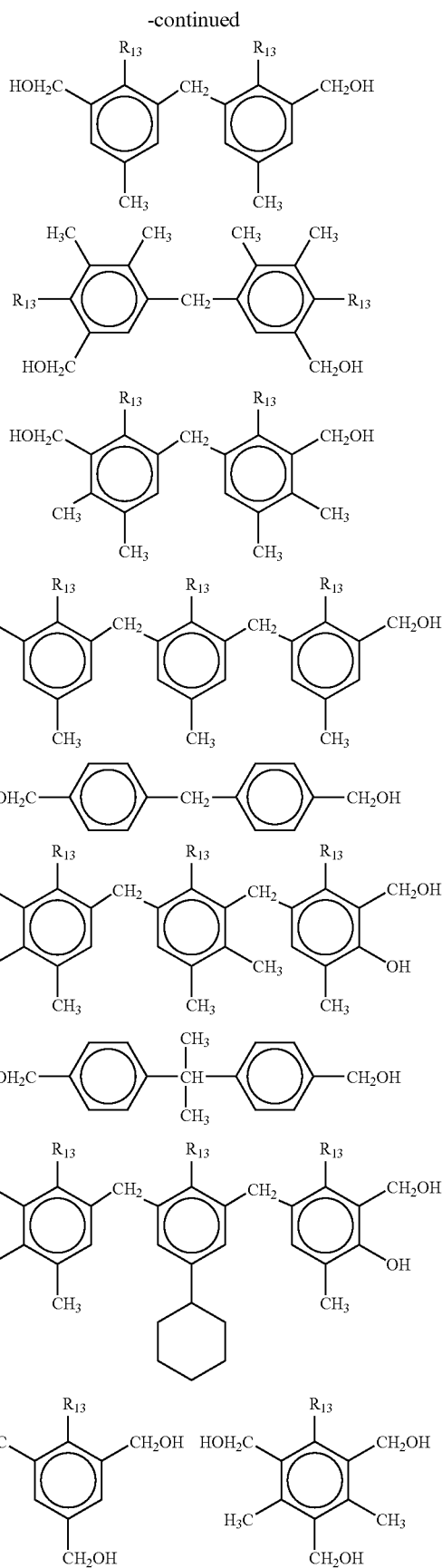

-continued

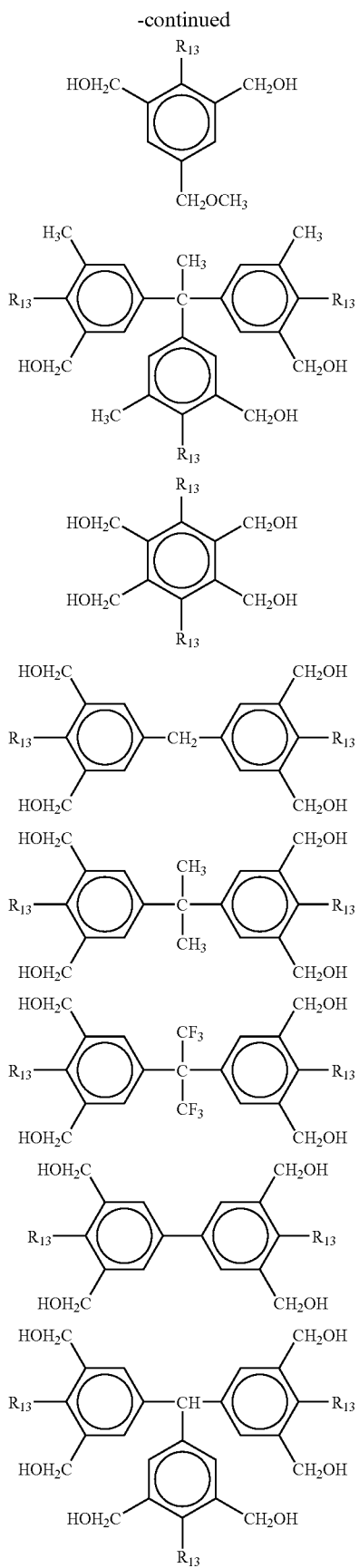

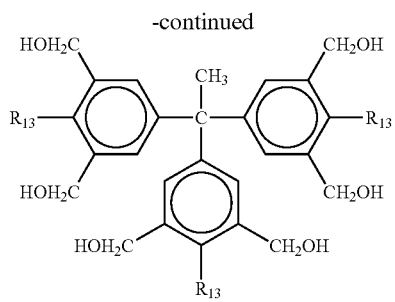

The compounding amount of the compound (C) which contains a —CH$_2$OH group but not a phenolic hydroxyl group of the present invention is preferably 1 to 100 parts by weight to 100 parts by weight of the alkali soluble resin (A), more preferably 5 to 50 parts by weight.

The positive-working photosensitive resin composition using a compound (C) which contains a —CH$_2$OH group but not a phenolic hydroxyl group of the first aspect of the present invention preferably has a transmittance of about 40% or more at wave length of about 500 nm using a film cured the composition at about 320° C. for about 60 minutes under oxygen concentration of about 10 ppm or less and having a thickness of about 5 μm. If the transmittance is less than about 40%, transparency is unsatisfactory and not preferable.

In the present invention, the compounding components are dissolved in a solvent and used in a state of varnish.

The solvent used in the first aspect of the present invention includes N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propyrene glycol monomethyl ether, dipropyrene glycol monomethyl ether, propyrene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxy propionate or the like, and may be used solely or in a mixture.

On the other, the solvent used in the second aspect of the present invention is a mixture solvent of two or more kinds (D), wherein the mixture solvent (D) contains γ-butyrolactone and propylene glycol monoalkyl ether and the total amount of γ-butyrolactone and propylene glycol monoalkyl ether is about 70 wt % or more of the total amount of solvent.

γ-butyrolactone is a good solvent to an alkali soluble resin and a photosensitive diazoquinone, thus an essential component of the second aspect of the present invention. The propylene glycol monoalkyl ether used in the second aspect of the present invention operates to improve coating uniformity and to reduce scum. As propylene glycol monoalkyl ether, there may be preferably used propyleneglycol monomethyl ether, propyleneglycol monoethyl ether, propylene glycol monopropyl ether or propylene glycol monobutyl ether. Among them, propylene glycol monomethyl ether is more preferable. The compounding amount of the propylene glycol monoalkyl ether is preferably about 80 wt % or less of the total amount of solvent. If the amount thereof exceeds about 80 wt %, uniformity in film thickness after coating may decrease or a photosensitive diazoquinone may be separated out from the composition.

In mixture solvent (D), the compounding ratio of γ-butyrolactone and propylene glycol monoalkyl ether is preferably about 1:9 to 9:1 in weight ratio, further about 2:8 to 8:2 is more preferable.

In the second aspect of the present invention, it is further preferable in terms of attaining high sensitivity that the mixture solvent (D) further contains a solvent having dipole moment of about 3.5 debye or more other than γ-butyrolactone and propylene glycol monoalkyl ether besides γ-butyrolactone and propylene glycol monoalkyl ether.

As the solvent having dipole moment of about 3.5 debye or more, there may be used N-methyl-2-pyrrolidone, dimethyl sulfoxide, sulfolane, N,N-dimethylformamide, N,N-dimethylacetamide, ε-caprolactam, acetonitrile, acryronitrile, benzonitrile, butanenitrile, crotonaldehyde, ethylene carbonate, formamide, isobutylnitrile, methacrylonitrile, N-methylacetoamide, 4-methylbutanenitrile, N-methylformamide, pentanenitrile, pentaneacetonitrile, propanenitrile, propionenitrile, 2-pyrrolidinone or 1,3-dimethyl-2-imidazole, but may not be limited. Among them, N-methyl-2-pyrolidon, dimethyl sulfoxide and sulfolane are preferable.

The compounding amount of the solvent having dipole moment of about 3.5 debye or more is about 30 wt % or less of the total amount of the solvent to be used. If the amount thereof exceeds about 30 wt %, it may become easy to generate scum. The solvent having dipole moment of about 3.5 debye or more may be used solely or in two or more kinds.

In the present invention, the compounding amount of the mixture solvent (D) may not be limited unless the mixture solvent (D) makes a photosensitive resin composition in a state of varnish. Normally, the compounding amount of the mixture solvent (D) is about 100 to 2000 parts by weight to 100 parts by weight of the alkali soluble resin (A).

In the second aspect of the present invention, in order to further increase the sensitivity, the compound (C) which contains a —CH2OH group but not a phenolic hydroxyl group or a compound containing a phenolic hydroxyl group may be used together. From the point of view that a positive-working photosensitive resin composition wherein the composition has high sensitivity and is capable of patterning without scum and a film of the composition after curing has low coloring and low water absorption properties can be obtained, even in the second aspect of the present invention, it is more preferable to use the compound (C) which contains a —CH$_2$OH group but not a phenolic hydroxyl group together.

On the other hand, as the compound containing a phenolic hydroxyl group, there may be examples as follows but may not be limited:

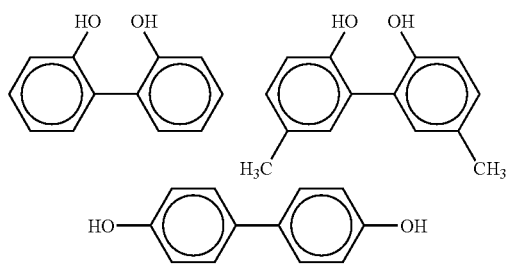

-continued

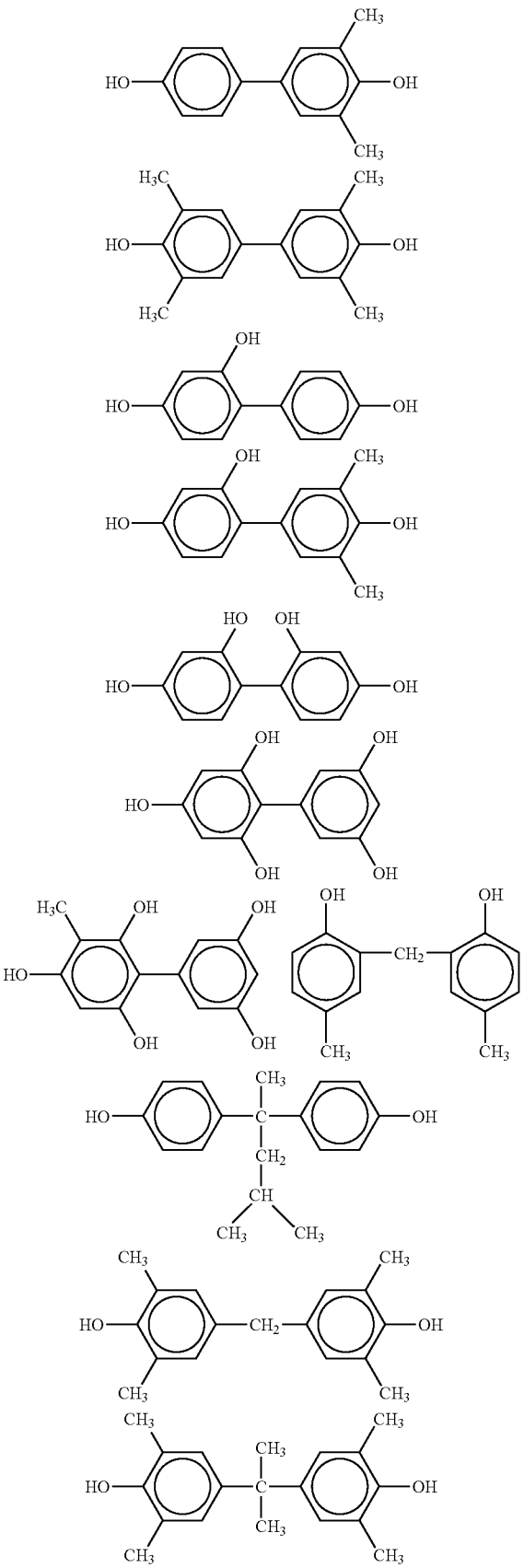

-continued
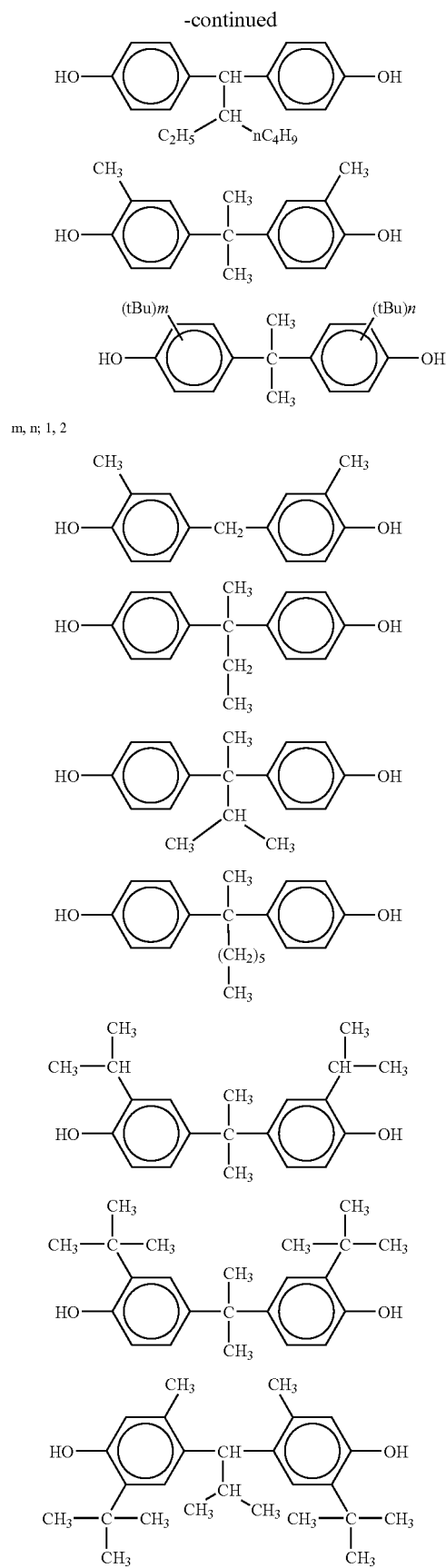
m, n; 1, 2
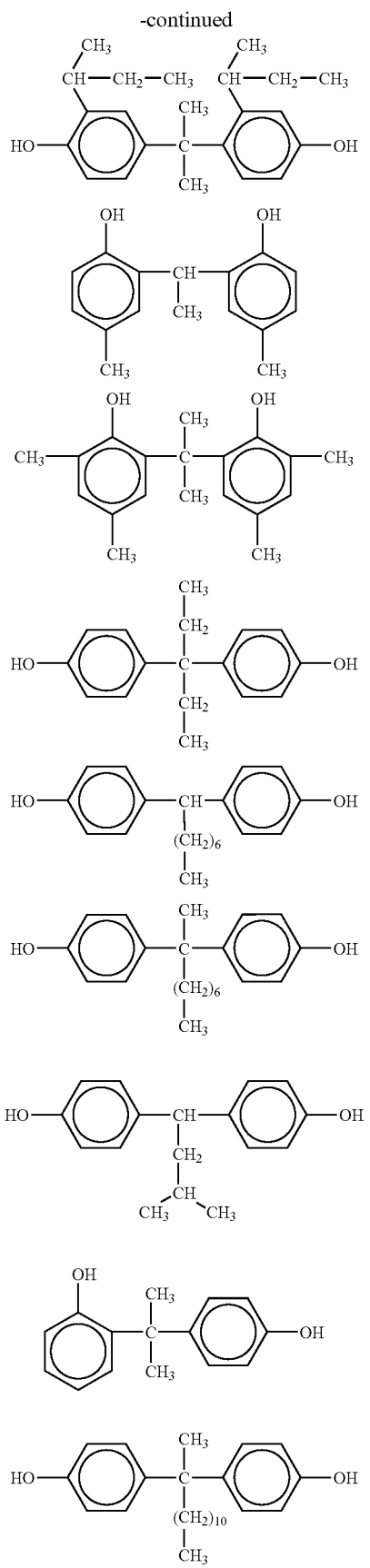

-continued
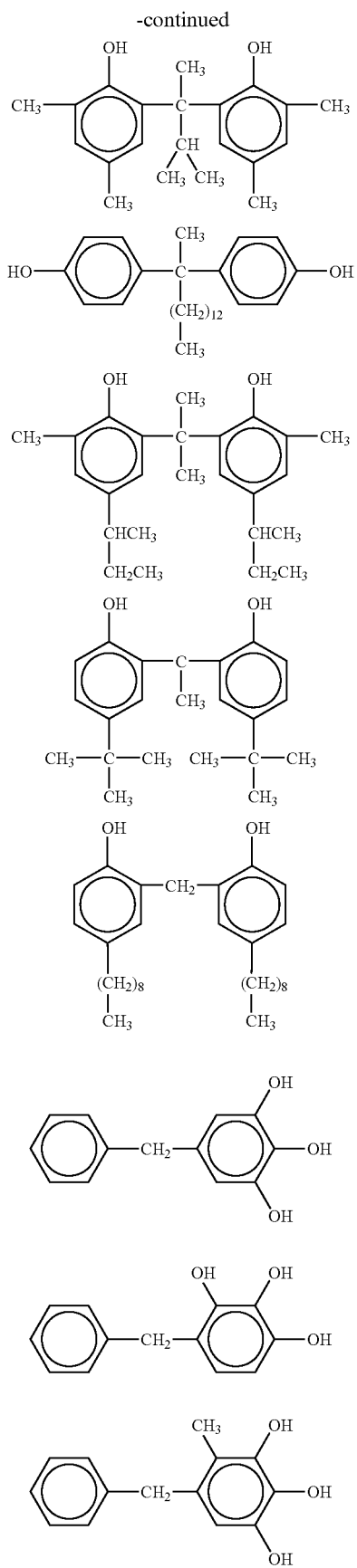
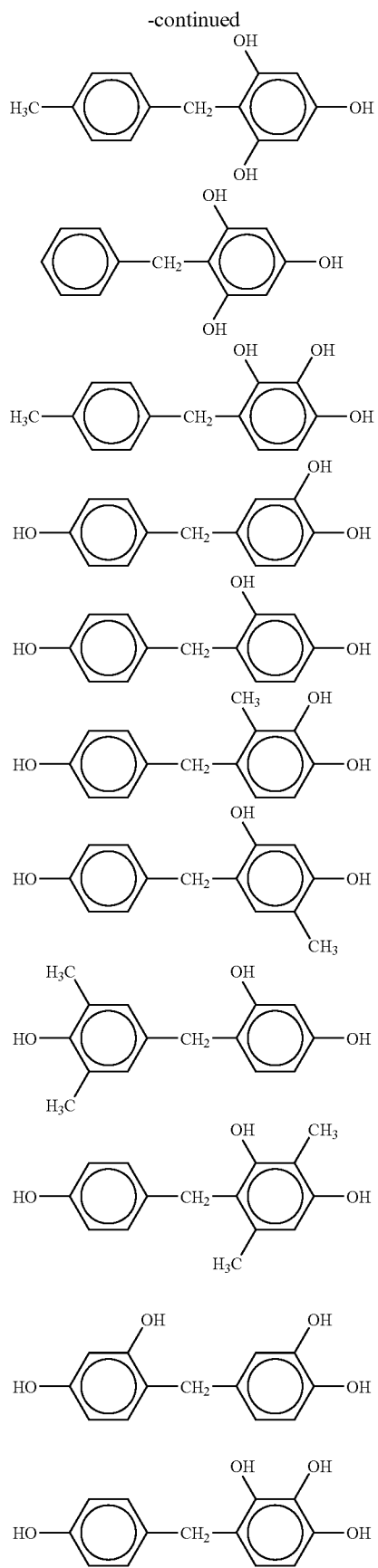

-continued
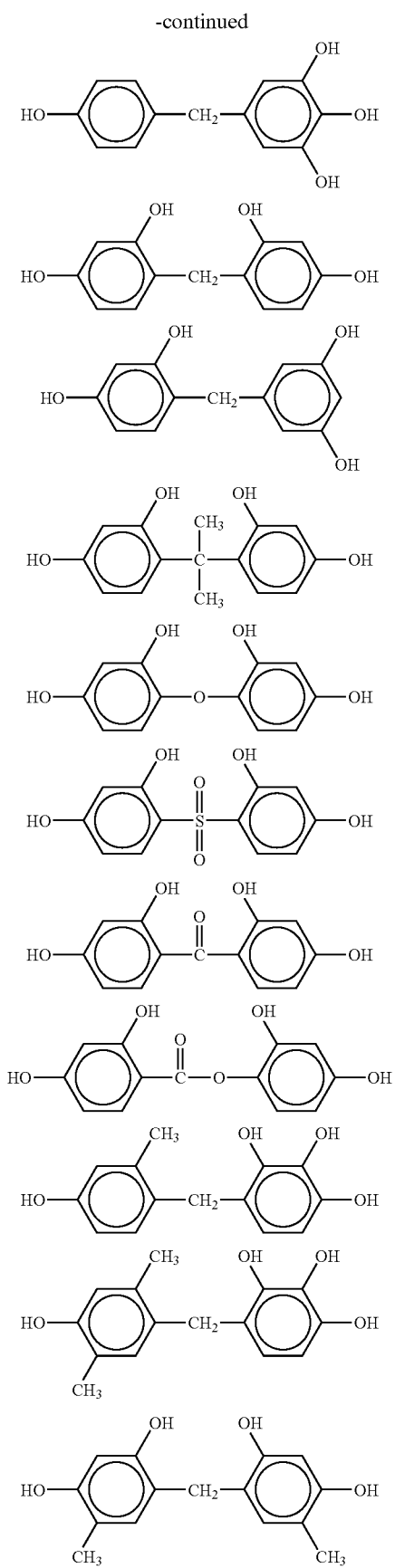
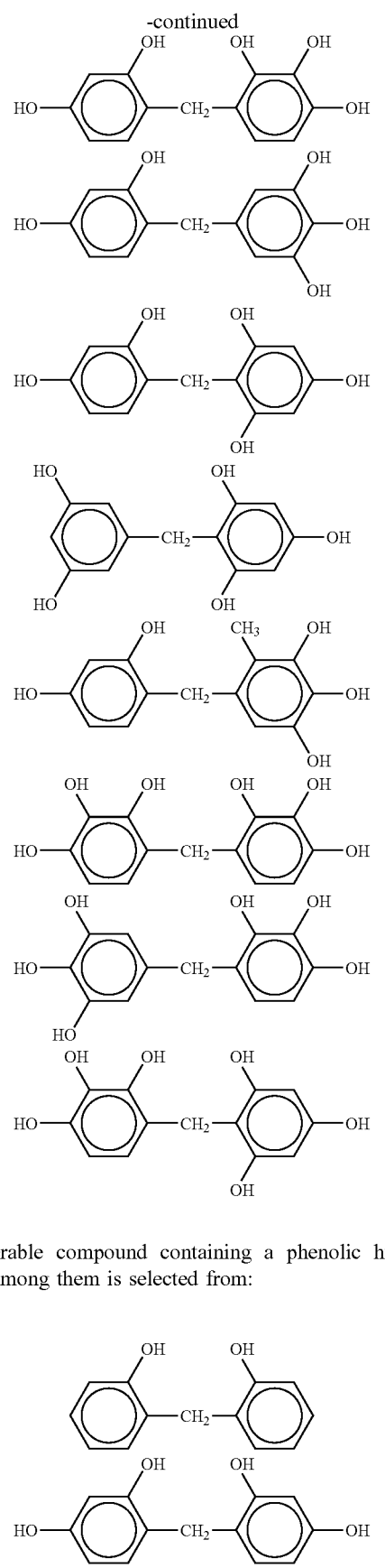
Preferable compound containing a phenolic hydroxyl group among them is selected from:
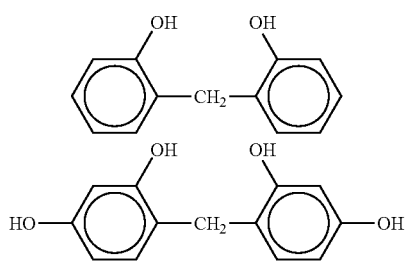

-continued

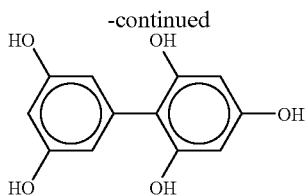

The compounding amount of the compound containing a phenolic hydroxyl group is preferably 1 to 30 parts by weight to 100 parts by weight of the alkali soluble resin (A).

An additive such as a leveling agent, a silane coupling agent or the like may be added to the positive-working photosensitive resin composition of the present invention if required.

In the present invention, the positive-working photosensitive resin composition containing the alkali soluble resin (A), the diazoquinone compound (B), the compound (C) which contains a —CH$_2$OH group but not a phenolic hydroxyl group and the mixture solvent of two or more kinds (D), wherein the mixture solvent (D) contains γ-butyrolactone and propylene glycol monoalkyl ether and the total amount of γ-butyrolactone and propylene glycol monoalkyl ether is about 70 wt % or more of the total amount of solvent can obtain a positive-working photosensitive resin composition wherein the composition has high sensitivity and is capable of patterning without scum and a film of the composition after curing has low coloring, low water absorption properties, and excellent uniformity in film thickness.

With regard to a method for using the positive-working photosensitive resin composition of the present invention, first, said composition is coated on a suitable base material, for instance, a silicon wafer, a ceramic substrate, an aluminum substrate or the like. An amount to be coated is determined so that a final thickness of coating film after curing becomes about 0.1 to 50 μm in the case of a semiconductor device, more preferably about 0.1 to 30 μm. If film thickness is below about 0.1 μm, it is difficult to fully exert a function as a surface protective film for a semiconductor element, and if the thickness exceeds about 50 μm, not only makes it difficult to obtain a finely processed pattern but to lower throughput due to a prolonged processing time. A method for coating includes a spin coating using a spinner, a spray coating using a spray coater, a dipping, a printing, a roll coating or the like.

Secondly, the coating film is dried by prebaking at 60 to 130° C. to form a composition layer and thereafter irradiated with an active energy ray in a desired pattern form. An active energy ray refers to an energy ray including electromagnetic wave, radiation or energy ray having an intermediate property between them. An active energy ray to be used includes X-ray, electron beam, ultraviolet ray, visible ray or the like, and has preferably a wavelength of 200 to 500 nm.

Next, a postbaking process may follow. The postbaking process is performed at 60 to 150° C. for 10 seconds to 30 minutes. For heating, a hotplate, a simple oven, a diffusing furnace or the like may be used.

Thirdly, the exposed area is removed by contacting and dissolving with a developing solution to form a relief pattern. A developing solution to be suitably used includes inorganic alkalis such as sodium hydroxide, potassium hydroxide, sodium carbonate, sodium silicate, sodium metasilicate, aqueous ammonia or the like; primary amines such as ethylamine, n-propylamine or the like; secondary amines such as diethylamine, di-n-propylamine or the like; tertiary amines such as triethylamine, methyldiethylamine or the like; alcohol amines such as dimethyl ethanol amine, triethanol amine or the like; an aqueous solution of alkalis such as a quaternary ammonium salt such as tetramethylammonium hydroxide, tetraethylammonium hydroxide or the like; or an aqueous solution obtained by adding a suitable amount of a water-soluble organic solvent, for example, an alcohol such as methanol or ethanol or a surfactant to the above aqueous solution of alkalis. As a method for developing, those such as spraying, paddling, dipping, supersonic methods or the like can be used.

Subsequently, the relief pattern formed by development is rinsed. Ion-exchange water or distilled water is used for rinsing.

Then, a heat treatment is applied to form an oxazole ring and/or an imide ring and obtain a final pattern of high heat resistance when an alkali soluble resin (A) is a resin containing one or more structures selected from a polybenzoxazole structure, a polybenzoxazole precursor structure, a polyimide structure, a polyimide precursor structure and a polyamic ester structure.

The present invention can form a pattern-formed resin film with high performance on a substrate by using a photosensitive resin composition of the present invention. As examples of application of the composition to make best use of its feature, there are a semiconductor device and a display device.

A specific example of a resin film using said photosensitive resin composition for a semiconductor device includes a passivation film and a buffer coating film formed on a semiconductor element, and an interlayer insulation film or the like formed on a circuit located on a semiconductor element.

A specific example of a resin film using said photosensitive resin composition for a display device includes an interlayer insulation film for TFT (Thin Film Transistor) element, a leveling film for TFT element, a leveling film for a color filter, a protrusion for MVA (Multi-domain Vertical Alignment) type liquid crystal display device, a liquid crystal alignment layer for a liquid crystal display device, a cathode partition for an organic EL device, an insulation film for an organic EL device or the like. The photosensitive resin composition for a display device is similarly used as a semiconductor. On a certain location of a substrate for display device wherein said resin film or the like is formed, a pattern-formed layer made of cured product of a photosensitive resin composition is formed by the above-mentioned means. High transparency is required for a resin film for a display device, particularly an interlayer insulation film and a leveling film. In such cases, introducing a postexposure process as mentioned in Example at the time of forming a layer made of cured product of the photosensitive resin composition is significantly preferable for practical use since a resin film excellent in transparency can be obtained.

A semiconductor device and a display device of the present invention can be produced using said photosensitive resin composition which may not be limited except that the semiconductor device and the display device have a layer made of cured product of the composition, can be of various structures and be produced by conventionally known production methods.

Among them, as an application example using a photosensitive resin composition of the present invention for a semiconductor device, an application to a semiconductor device having a bump will be described with reference to figures. FIG. 1 is an enlarged cross-sectional view showing a pad portion of a semiconductor device having a bump of the present invention. As shown in FIG. 1, a passivation film 3 is formed on an Al pad 2 for input and output formed on a silicon wafer 1, and a via hole is formed on the passivation film 3. Further, thereon is formed an insulation protective film (a buffer coating film) 4 made of cured product of the photosensitive resin composition of the present invention, on which a metal (Cr, Ti or the like) film 5 is formed so that the metal film 5 is connected to the Al pad 2. The metal film 5 is etched as to leave surrounding area from the via hole to a solder bump 9 in order to insulate between each pad. A wiring 6 is formed on the insulated pad by plating or the like, and thereon is formed an insulation film 7 made of cured product of the photosensitive resin composition of the present invention. In the via hole formed by photolithography, a barrier metal 8 and the solder bump 9 are formed. A highly reliable semiconductor device can be provided as the film formed by using the photosensitive resin composition of the present invention is capable of patterning without scum, and has low coloring in a film and low water absorption properties or has uniformity in film thickness.

A positive-working photosensitive resin composition of the present invention is useful not only for a semiconductor and a display device, but also for an interlayer insulation for a multilayered circuit, a cover coating for a flexible cupper-clad plate, a solder resist film, a liquid crystal alignment layer or the like.

In this way, according to the first aspect of the present invention, a positive-working photosensitive resin composition which is capable of patterning at high sensitivity without scum, and has low coloring in a film after curing and low water absorption properties, a method for producing a pattern-formed resin film using the composition, a semiconductor device and a display device using the composition, and a method for producing the semiconductor device and the display device.

Also, according to the second aspect of the present invention, a positive-working photosensitive resin composition which is capable of patterning at high sensitivity without scum and excellent in uniformity in film thickness, a method for producing a pattern-formed resin film using the composition, a semiconductor device and a display device using the composition, and a method for producing the semiconductor device and the display device.

EXAMPLE

Example Series I

Examples of the First Aspect of the Present Invention

Example I-1

[Synthesis of a Polyamide Resin]

A dicarboxylic acid derivative of 360.4 g (0.9 mol) obtained by reacting 0.9 mol of terephthalic acid, 0.1 mol of isophthalic acid and 2 mol of 1-hydroxy-1,2,3-benzotriazole, and 366.3 g (1 mol) of hexafluoro-2,2-bis(3-amino-4-hydroxy phenyl)propane were charged in a four-necked separable flask equipped with a thermometer, an agitator, a feed inlet and a dry nitrogen gas inlet tube. 3,000 g of N-methyl-2-pyrrolidone was added for dissolution. The thus obtained mixture was then reacted at 75° C. in an oil bath for 12 hours.

32.8 g (0.2 mol) of 5-norbornene-2,3-dicarboxylic anhydride dissolved in 500 g of N-methyl-2-pyrrolidone was then added to the above mixture, and they were reacted for another 12 hours while stirring. Then, the reaction mixture was collected by filtration and poured into a solution of water/methanol of 3/1 (volume ratio) and a precipitate was formed. The precipitate was collected by filtration, rinsed sufficiently with water and then dried under vacuum to obtain a desired polyamide resin (PA-1) represented by the formula (1), wherein X was represented by the formula X-1 below, Y was a mixture of the formulae Y-1 and Y-2 below, a=100, and b=0.

[Production of a Positive-Working Photosensitive Resin Composition]

The synthesized polyamide resin (PA-1) of 100 g, 20 g of a diazonaphthoquinone compound having a structure represented by the formula (S-1) below and log of a compound which contains a —CH2OH group but not a phenolic hydroxyl group represented by the formula (M-1) were dissolved in γ-butyrolactone and then filtrated using a 0.2 μm filter made of a fluorocarbon resin to obtain a positive-working photosensitive resin composition.

[Evaluation of Characteristics]

The obtained positive-working photosensitive resin composition was coated on a silicon wafer using a spincoater and then dried at 120° C. for 3minutes using a hotplate to obtain a coating film of about 5 μm thickness. The thus obtained coating film was exposed through a mask made by TOPPAN PRINTING CO., LTD. (Test Chart No. 1: patterns for remaining and patterns for removing of 0.88 to 50 μm width were depicted) using an i-line stepper NSR-4425i made by Nicon Corp., with various exposure amounts from 100 mJ/cm$^2$ increased by 20 mJ/cm$^2$ each. Then, the light-exposed coating film was dipped in a 2.38% aqueous solution of tetramethylammonium hydroxide for 30 seconds to dissolve and remove the exposed area, followed by rinsing with pure water for 30 seconds. As a result, it was confirmed that a pattern had been formed in an exposed area at the exposure amount of 260 mJ/cm$^2$ and a resolution was 5 μm.

The coating film was then heated and cured in a clean oven at150° C./30minutes and 350° C./60minutes under a nitrogen atmosphere. The thus obtained cured film was dipped in a 3% hydrogen fluoride solution to peel the film from the silicon wafer. The thus peeled film was sufficiently rinsed with pure water and then dried in an oven at 60° C./5 hours. Transmittance at wavelength 500 nm of the obtained film was measured by a spectrophotometer resulting in a high transparency of 62% per 5 μm film thickness.

Further, after drying the obtained film at 50° C. for 24 hours, water absorption coefficient thereof was measured by dipping the dried film in a 23° C. pure water (in conformity with JIS-K7209) The water absorption coefficient was low and 0.28%.

Example I-2

A positive-working photosensitive resin composition was obtained similarly as in Example I-1 except that a compound M-1 which contains a —CH2OH group but not a phenolic hydroxyl group in Example I-1 was changed to 15 g of M-2, and evaluated similarly as in Example I-1.

Example I-3

A positive-working photosensitive resin composition was obtained similarly as in Example I-1 except that a diazonaphthoquinone compound (S-1) in Example I-1 was changed to 25 g of S-2, and evaluated similarly as in Example I-1.

Example I-4

A polyamide (PA-2) represented by the formula (1), wherein X was represented by the formula X-1 below; Y was represented by the formula Y-3 below; a=100, and b=0, was synthesized by using 1 mol of diphenylether-4,4'-dicarboxylic acid instead of 0.9 mol of terephthalic acid and 0.1 mol of isophthalic acid in the polyamide synthesis in Example I-1. A positive-working photosensitive resin composition was obtained similarly as in Example I-1 except the above, and evaluated similarly as in Example I-1.

Example I-5

A mixture of 17.1 g (0.055 mol) of 4,4'-oxydiphthalic anhydride, 13.0 g (0.110 mol) of 2-methyl-2-propanol and 10.9 g (0.138 mol) of pyridine were charged in a four-necked separable flask equipped with a thermometer, an agitator, a feed inlet and a dry nitrogen gas inlet tube. 3,000 g of N-methyl-2-pyrrolidone was added for dissolution. After 14.9 g (0.110 mol) of 1-hydroxy-1,2,3-benzotriazole and 30 g of N-methyl-2-pyrrolidone were dropped in the reacted solution, 22.7 g (0.110 mol) of dicyclohexylcarbodiimide and 50 g of N-methyl-2-pyrrolidone were dropped in the above solution and reacted at a room temperature overnight.

Subsequently, 27.1 g (0.055 mol) of a dicarboxylic acid derivative (activated ester) obtained by reacting 1 mol of diphenylether-4,4'-dicarboxylic acid and 2 mol of 1-hydroxy-1,2,3-benzotriazole, 44.7 9 (0.122 mol) of hexafluoro-2,2-bis(3-amino-4-hydroxyphenyl)propane and 70 g of N-methyl-2-pyrrolidone were added to the above reacted solution and stirred at a room temperature for 2 hours. Then, the above mixture was reacted similarly as in Example I-1 except that the mixture was reacted at 75° C. for 12 hours using an oil bath to synthesize a polyamide resin (PA-3) represented by the formula (1), wherein X was represented by the formula X-1 below; Y was a mixture of the formulae Y-3 and Y-4 below; a=100, and b=0. A positive-working photosensitive resin composition was obtained similarly as in Example I-1 except the above, and evaluated similarly as in Example I-1.

Example I-6

After dissolving 22.0 g (0.06 mol) of hexafluoro-2,2-bis(3-amino-4-hydroxyphenyl)propane in 100 g of N-methyl-2-pyrrolidone, 25.3 g (0.12 mol) of trimellitic chloride dissolved in 80 g of N-methyl-2-pyrrolidone was added into the above mixture on cooling at 5° C. or below. Pyridine 11.4 g (0.144 mol) was further added and stirred at 20° C. or below for 3 hours. Next, 4,4'-diaminodiphenylether 12.0 g (0.06 mol) was added to the mixture and reacted at room temperature for 5 hours followed by raising the inner temperature to 85° C. and stirring for 3 hours. After reaction, there action mixture was filtered. The filtrate was poured into a solution of water/methanol of 5/1 (volume ratio) and a precipitate was formed. The precipitate was collected by filtration, rinsed sufficiently with water and then dried under vacuum to obtain a desired polyamide (PA-4) represented by the formula (1), wherein X was represented by the formulae X-1 and X-2 below, Y was represented by the formula Y-5 below, a=100, and b=0. A positive-working photosensitive resin composition was obtained similarly as in Example I-1 except the above, and evaluated similarly as in Example I-1.

Comparative Example I-1

A positive-working photosensitive resin composition was obtained similarly as in Example I-1 except that 10 g of a compound (M-1) which contains a —CH2OH group but not a phenolic hydroxyl group was not added, and evaluated similarly as in Example I-1.

Comparative Example I-2

A positive-working photosensitive resin composition was obtained similarly as in Example I-1 except that a compound (M-1) which contains a —CH2OH group but not a phenolic hydroxyl group in Example I-1 was changed to 10 g of a compound represented by the formula (M-3) below, and evaluated similarly as in Example I-1.

X-1:

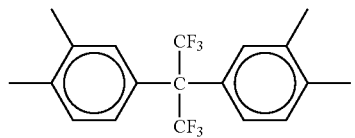

X-2:

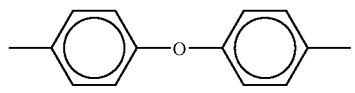

Y-1:

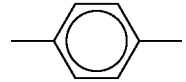

Y-2:

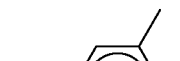

Y-3:

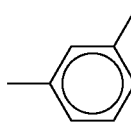

Y-4:

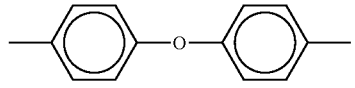

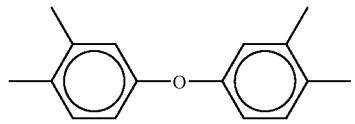

Y-5:

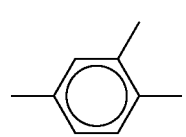

-continued
S-1:
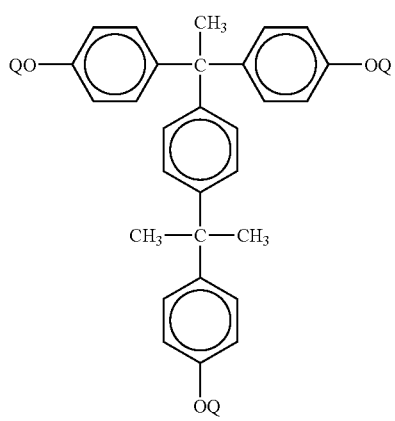
(In the formula, Q is hydrogen atom or:
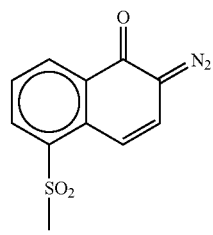
and 85% of all Q are:
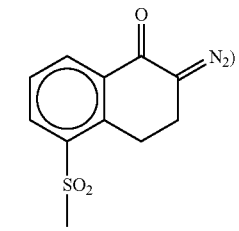
S-2:
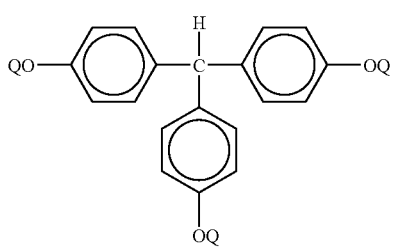
(In the formula, Q is hydrogen atom or:
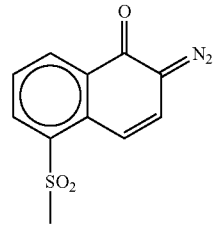
and 90% of all Q are:
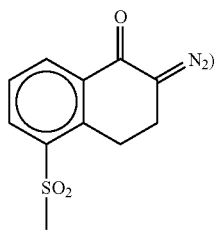
M-1:
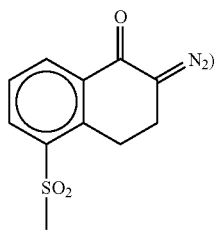
M-2:
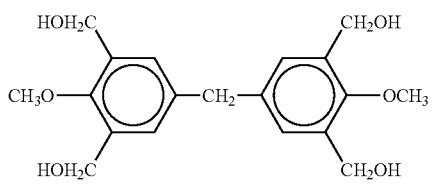
M-3:
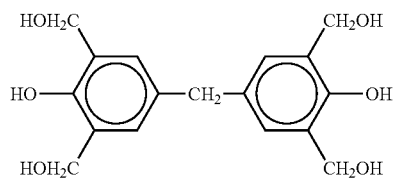
The compounding amounts of Examples I-1 to I-6 and Comparative examples I-1 to I-2 are shown in Table I-1, and the evaluation results thereof are shown in Table I-2.

TABLE I-1

| | Compounding amount | | | | |
|---|---|---|---|---|---|
| | Alkali soluble resin (A) | | Diazonaphthoquinone compound (B) | Compound containing —CH$_2$OH (C) | |
| | 100 g | Amine | Acid | (g) | (g) |
| Example I-1 | PA-1 | X-1 | Y-1, Y-2 | S-1 20 | M-1 10 |
| Example I-2 | PA-1 | X-1 | Y-1, Y-2 | S-1 20 | M-2 15 |
| Example I-3 | PA-1 | X-1 | Y-1, Y-2 | S-1 25 | M-1 10 |
| Example I-4 | PA-2 | X-1 | Y-3 | S-1 20 | M-1 10 |
| Example I-5 | PA-3 | X-1 | Y-3, Y-4 | S-1 20 | M-1 10 |
| Example I-6 | PA-4 | X-1, X-2 | Y-5 | S-1 20 | M-1 10 |
| Comparative Example I-1 | PA-1 | X-1 | Y-1, Y-2 | S-1 20 | none |
| Comparative Example I-2 | PA-1 | X-1 | Y-1, Y-2 | S-1 20 | M-3 10 |

TABLE I-2

| | Characteristics | | | | |
|---|---|---|---|---|---|
| | Sensitivity (mJ/cm$^2$) | Resolution (μm) | Presence of Scum | Transmittance (%) | Water absorption coefficient (%) |
| Example I-1 | 260 | 5 | None | 62 | 0.28 |
| Example I-2 | 240 | 3 | None | 66 | 0.29 |
| Example I-3 | 280 | 5 | None | 58 | 0.30 |
| Example I-4 | 260 | 5 | None | 60 | 0.55 |
| Example I-5 | 280 | 3 | None | 59 | 0.55 |
| Example I-6 | 280 | 5 | None | 57 | 0.59 |
| Comparative Example I-1 | 320 | 10 | Presence | 39 | 0.28 |
| Comparative Example I-2 | 300 | 7 | None | 35 | 0.61 |

A positive-working photosensitive resin composition of Comparative example I-1, which does not contain a compound (C) which contains a —CH$_2$OH group but not a phenolic hydroxyl group, had low sensitivity and scum was generated. On the other hand, a positive-working photosensitive resin composition of examples of the present invention had high sensitivity and scum was not generated. Moreover, the examples of the present invention had high transmittance, low coloring and high resolution.

Comparing Examples I-1 and I-2 and Comparative examples I-1 and I-2 using the same alkali soluble resin (A) and diazoquinone compound (B), it reveals that Comparative example I-2 used a compound containing a phenolic hydroxyl group had slightly higher sensitivity than Comparative example I-1 and no scum but was inferior in water absorption coefficient and transmittance to Examples 1 and 2 used a compound (C) which contains a —CH$_2$OH group but not a phenolic hydroxyl group.

Example I-7

[Production of Display Device and Evaluation of Characteristics]

An ITO film deposited and formed on a glass substrate was divided in stripe form by a usual photolithography method using a photoresist, on which a positive-working photosensitive resin composition obtained in Example I-1 was coated to form a resin layer of about 2 μm thickness. Then, the above resin layer was subject to exposure through a glass musk at exposure strength of 25 mW/cm$^2$ for 10 seconds by a parallel exposure system (light source: high-pressure mercury-vapor lamp). Then, by dipping and developing the resin layer in a 2.38% aqueous solution of tetramethylammonium hydroxide for 20 seconds, a portion except an edge of each ITO on ITO in stripe form was exposed and a resin layer was formed only on the edge of ITO film and a portion wherein an ITO film was removed. Subsequently, the thus processed substrate was subject to post exposure at exposure strength of 25 mW/cm$^2$ for 40 seconds by the parallel exposure system used upon exposing on the whole resin layer, and heat-curing in the air at 250° C. for 1 hour by a hot-air circulating drier.

On this substrate, copper phthalocyanine as a positive hole injection layer and bis-N-ethylcarbazole as a positive hole transport layer were deposited under reduced pressure of $1 \times 10^{-4}$ Pa or less prior to depositing N,N'-diphenyl-N,N'-m-toluyl-4,4'-diamino-1,1'-biphenyl as a light emitting layer and tris(8-quinolinolate)aluminum as an electron injection layer thereon in this order. Further, after depositing and forming an aluminum layer as a second electrode thereon, the aluminum layer was divided in stripe form of a direction perpendicular to the stripe of said ITO film by a usual photolithography method using a photoresist. The substrate thus obtained was dried under reduced pressure and a glass plate for sealing was adhered using an epoxy based adhesive to obtain a display device. The display device was subject to sequential activation by applying voltage to both electrodes after processing at 80° C. for 250 hours, however, the display device emitted light without problem.

Example Series II;

Examples of the Second Aspect of the Present Invention

Example II-1

[Synthesis of a Polyamide Resin]

0.016 mol of a mixture of dicarboxylic acid derivative obtained by reacting 4.13 g (0.016 mol) of diphenylether-4,4'-dicarboxylic acid and 4.32 g (0.032 mol) of 1-hydroxy-1,2,3-benzotriazole, and 7.33 g (0.020 mol) of hexafluoro-2,2-bis(3-amino-4-hydroxy phenyl)propane were charged in a four-necked separable flask equipped with a thermometer, an agitator, a feed inlet and a dry nitrogen gas inlet tube. N-methyl-2-pyrrolidone of 57.0 g was added and for dissolution. The thus obtained mixture was then reacted at 75° C in an oil bath for 12 hours. 1.31 g (0.08 mol) of 5-norbornene-2,3-dicarboxylic anhydride dissolved in 7 g of N-methyl-2-pyrrolidone was then added to the above mixture, and they were reacted for another 12 hours while stirring. After reaction, the reaction mixture was filtered. The filtrate was poured into a solution of water/methanol of 3/1 (volume ratio) and a precipitate was formed. The precipitate was collected by filtration, rinsed sufficiently with water and then dried under vacuum to obtain a desired polyamide resin (A-1).

[Production of a Resin Composition]

The synthesized polyamide resin (A-1) of 10 g and 2 g of a photosensitive diazoquinone having a structure represented by the formula (B-1) below were dissolved in 20 g of a mixture solution of γ-butyrolactone/propylene glycol methyl ether/N-methyl-2-pyrrolidone=50/20/30 (weight ratio) and then filtrated using a 0.2 μm filter made of a fluorocarbon resin to obtain a positive-working photosensitive resin composition.

[Evaluation of Characteristics]

Figure 2:
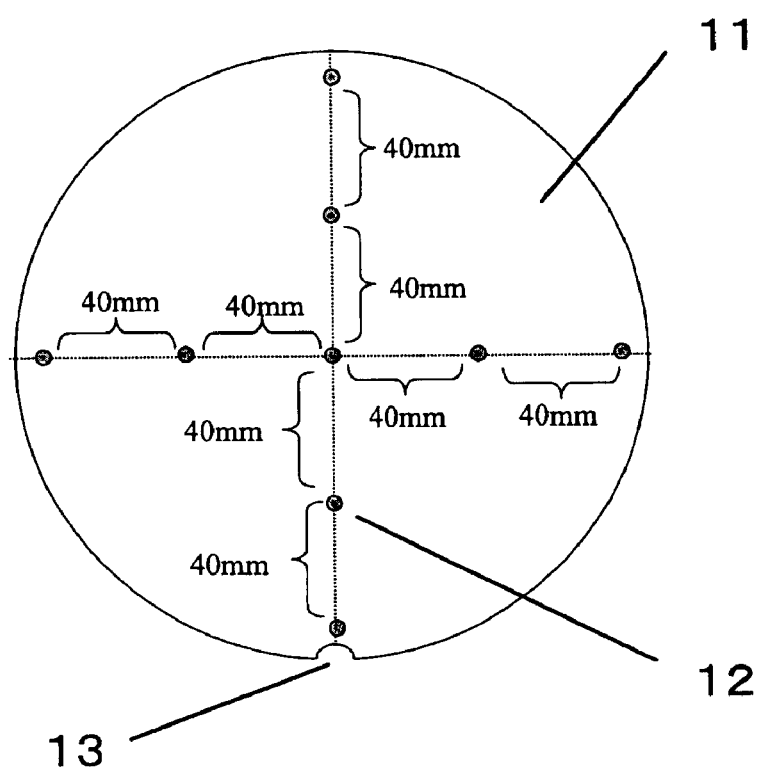
FIG. 2 is a view showing a part of 8-inch wafer in which a film thickness is measured.

The obtained positive-working photosensitive resin composition was coated on 8 inches of a silicon wafer using a spincoater and then dried at 120° C. for 4 minutes using a hotplate to obtain a coating film of about 10 μm thickness. Film thickness of the thus obtained coating film was measured on a surface of 8-inch wafer at 9 places (see FIG. 2). The range of film thickness (maximum value—minimum value) was 0.06 μm and preferable. The coating film was exposed through a mask made by TOPPAN PRINTING CO., LTD. (Test Chart No. 1: patterns for remaining and patterns for removing of 0.88 to50 μm width were depicted) using an i-line stepper NSR-4425i made by Nicon Corp., with various exposure amounts from 100 mJ/cm² increased by 10 mJ/cm² each. The coating film was rinsed with pure water for 30 seconds after an exposed area of the composition was dissolved and removed by developing in a 2.38% aqueous solution of tetramethylammonium hydroxide for time adjusted so that reduction in film thickness after development was 1.5 μm. As a result of observing pattern, it was confirmed that a portion to be opened in the pattern had been preferably formed with no presence of scum at the exposure amount of 290 mJ/cm². Then, film thickness of unexposed area was measured and the range of film thickness was 0.11 μm and preferable.

Examples II-2 to II-10

A positive-working photosensitive resin composition was obtained similarly as in Example II-1 except that γ-butyrolactone/propylene glycol methyl ether/N-methyl-2-pyrrolidone=5/2/3 used in Example II-1 was changed to solvent shown in Table II-1, and evaluated similarly as in Example II-1.

Example II-11

[Synthesis of a Polyamide Resin]

4,4'-oxydiphthalic anhydride of 17.06 g (0.055 mol), 8.15 g (0.110 mol) of 2-methyl-2-propanol, and 10.9 g (0.138 mol) of pyridine were charged in a four-necked separable flask equipped with a thermometer, an agitator, a feed inlet and a dry nitrogen gas inlet tube. 150 g of N-methyl-2-pyrrolidone was added for dissolution. After 14.9 g (0.110 mol) of 1-hydroxy-1,2,3-benzotriazole and 30 g of N-methyl-2-pyrrolidone were dropped in the reacted solution, 22.7 g (0.110 mol) of dicyclohexylcarbodiimide and 50 g of N-methyl-2-pyrrolidone were dropped in the above solution, and they were reacted at a room temperature overnight. Subsequently, 27.1 g (0.055 mol) of a dicarboxylic acid derivative (activated ester) obtained by reacting 1 mol of diphenylether-4,4'-dicarboxylic acid and 2 mol of 1-hydroxy-1,2,3-benzotriazole, 44.7 g (0.122 mol) of hexafluoro-2,2-bis(3-amino-4-hydroxyphenyl)propane and 70 g of N-methyl-2-pyrrolidone were added to the above reacted solution, and they were stirred at a room temperature for 2 hours. Then, the above mixture was reacted at 75° C. in an oil bath for 12 hours.

Next, 3.94 g (0.024 mol) of 5-norbornen-2,3-dicarboxylic anhydride dissolved in N-methyl-2-pyrrolidone 20 g was added to the mixture and reacted while stirring for 12 hours. A desired polyamide resin (A-2) was obtained similarly as in Example II-1 including reprecipitation and refining except the above.

[Production of a Positive-Working Photosensitive Resin Composition and Evaluation of Development Properties]

The synthesized polyamide resin (A-2) of 10 g and 2 g of a photosensitive diazoquinone having a structure represented by the formula (B-1) below were dissolved in 20 g of a mixture solution of γ-butyrolactone/propylene glycolmethyl ether/N-methyl-2-pyrrolidone=50/20/30 (weight ratio) and then filtrated using a 0.2 μm filter made of a fluorocarbon resin to obtain a positive-working photosensitive resin composition. The obtained positive-working photosensitive resin composition was evaluated similarly as Example II-1. The range of film thickness after coating was 0.08 μm. After exposure and development, it was confirmed that a portion to be opened in the pattern had been preferably formed with no presence of scum at the exposure amount of 300 mJ/cm². Further, film thickness of unexposed area was measured and the range of film thickness was 0.12 μm and preferable.

Comparative Examples II-1 to II-4

A positive-working photosensitive resin composition was obtained similarly as in Example II-1 except that γ-butyrolactone/propylene glycolmethyl ether/N-methyl-2-pyrrolidone=50/20/30 used in Example II-1 was changed to solvent shown in Table II-1, and evaluated similarly as in Example II-1.

The evaluation results are shown in Table II-2.

B-1:

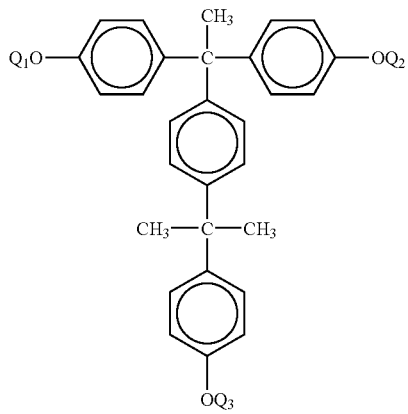

(In the formula, 75% of Q1, Q2, Q3 is:

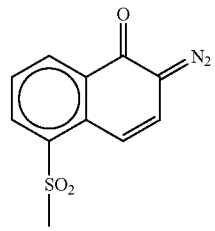

and 25% thereof is hydrogen atom)

B-2:

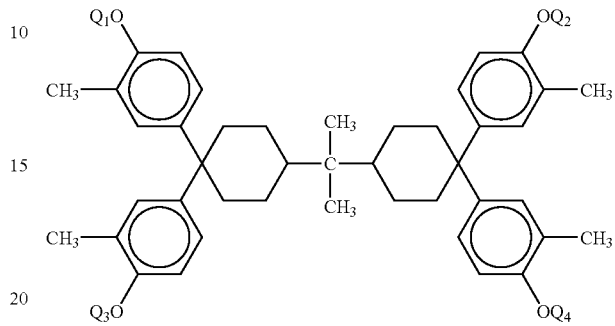

(In the formula, 87.5% of Q1, Q2, Q3, Q4 is:

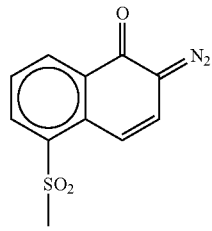

and 12.5% thereof is hydrogen atom)

TABLE II-1

| | Polyamide resin | Solvent 1 | Solvent 2 | Solvent 3 | Solvent 4 | Solvent mixing ratio (ratio by weight) |
|---|---|---|---|---|---|---|
| Example II-1 | A-1 | GBL | PGME | NMP | — | 5:2:3 |
| Example II-2 | A-1 | GBL | PGME | NMP | — | 2:6:2 |
| Example II-3 | A-1 | GBL | PGME | NMP | — | 4:5:1 |
| Example II-4 | A-1 | GBL | PGEE | NMP | — | 5:3:2 |
| Example II-5 | A-1 | GBL | PGME | DMSO | — | 2:5:3 |
| Example II-6 | A-1 | GBL | PGME | DMSO | — | 5:3:1 |
| Example II-7 | A-1 | GBL | PGME | NMP | DMSO | 5:3:1:1 |
| Example II-8 | A-1 | GBL | PGME | Sulfolane | — | 5:3:1 |
| Example II-9 | A-1 | GBL | PGME | — | — | 5:5 |
| Example II-10 | A-1 | GBL | PGME | — | — | 3:7 |
| Example II-11 | A-2 | GBL | PGME | NMP | — | 5:2:3 |
| Comparative Example II-1 | A-1 | GBL | — | — | — | — |
| Comparative Example II-2 | A-1 | NMP | — | — | — | — |
| Comparative Example II-3 | A-1 | DMSO | — | — | — | — |

TABLE II-1-continued

| | Polyamide resin | Solvent 1 | Solvent 2 | Solvent 3 | Solvent 4 | Solvent mixing ratio (ratio by weight) |
|---|---|---|---|---|---|---|
| Comparative Example II-4 | A-1 | GBL | 2-heptanone | — | — | 5:5 |
| Comparative Example II-5 | A-1 | GBL | PGME | NMP | — | 3:2:5 |

GBL: γ-butyrolactone (4.1 D)
PGME: propylene glycol monomethyl ether (2.3 D)
PGEE: propylene glycol monoethyl ether (2.1 D)
NMP: N-methyl-2-pyrrolidone (4.1 D)
DMSO: dimethyl sulfoxide (4.3 D)
2-heptanone (2.6 D)
Sulfolane (4.8 D)

Herein, values in parentheses refer to dipole moment of solvent. Dipole moment is based on Solvent Handbook (Kodansha Ltd.) and LANGE'S HANDBOOK OF CHEMISTRY (McGRAW-HILL BOOK COMPANY). The dipole moment values not found in the above references were obtained by calculating optimal structure using WinMOPAC 3.0 (manufactured by Fujitsu Limited).

TABLE II-2

| | Sensitivity (mJ/cm$^2$) | Range of film thickness (μm) | | Presence of Scum |
|---|---|---|---|---|
| | | After coating | After development | |
| Example II-1 | 290 | 0.06 | 0.11 | None |
| Example II-2 | 290 | 0.06 | 0.12 | None |
| Example II-3 | 300 | 0.08 | 0.15 | None |
| Example II-4 | 290 | 0.07 | 0.14 | None |
| Example II-5 | 280 | 0.05 | 0.11 | None |
| Example II-6 | 300 | 0.06 | 0.14 | None |
| Example II-7 | 280 | 0.08 | 0.15 | None |
| Example II-8 | 280 | 0.09 | 0.15 | None |
| Example II-9 | 320 | 0.06 | 0.22 | None |
| Example II-10 | 330 | 0.07 | 0.19 | None |
| Example II-11 | 300 | 0.08 | 0.12 | None |
| Comparative Example II-1 | 350 | 0.32 | 0.65 | None |
| Comparative Example II-2 | 280 | 0.55 | 0.98 | Presence |
| Comparative Example II-3 | 290 | 0.68 | 1.02 | Presence |
| Comparative Example II-4 | 390 | 0.06 | 0.15 | None |
| Comparative Example II-5 | 280 | 0.11 | 0.25 | Presence |

Examples of the second aspect of the present invention were capable of patterning at high sensitivity without scum and excellent in uniformity in film thickness after coating and development. When a mixture solvent (D) contains γ-butyrolactone and propylene glycol monoalkyl ether having a total amount thereof as 70 wt % or more of the total amount of solvent, and a solvent other than γ-butyrolactone and propylene glycol monoalkyl ether having dipole moment of 3.5 debye, sensitivity was even higher and excellent in uniformity in film thickness.

Example II-12

[Production of Display Device and Evaluation of Characteristics]

An ITO film deposited and formed on a glass substrate was divided in stripe form by a usual photolithography method using a photoresist, on which a positive-working photosensitive resin composition obtained in Example I-1 was coated to form a resin layer of about 2 μm thickness. Then, the above resin layer was subject to exposure through a glass musk at exposure strength of 25 mW/cm$^2$ for 10 seconds by a parallel exposure system (light source: high-pressure mercury-vapor lamp). Then, by dipping and developing the resin layer in a 2.38% aqueous solution of tetramethylammonium hydroxide for 20 seconds, a portion except an edge of each ITO on ITO in stripe form was exposed and a resin layer was formed only on the edge of ITO film and a portion wherein an ITO film was removed. Subsequently, the thus processed substrate was subject to postexposure at exposure strength of 25 mW/cm$^2$ for 40 seconds by the parallel exposure system used upon exposing on the whole resin layer, and heat-curing in the air at 250° C. for 1 hour by a hot-air circulating drier.

On this substrate, copper phthalocyanine as a positive hole injection layer and bis-N-ethylcarbazole as a positive hole transport layer were deposited under reduced pressure of $1 \times 10^{-4}$ Pa or less prior to depositing N,N'-diphenyl-N, N'-m-toluyl-4,4'-diamino-1,1'-biphenyl as a light emitting layer and tris(8-quinolinolate) aluminum as an electron injection layer thereon in this order. Further, after depositing and forming an aluminum layer as a second electrode thereon, the aluminum layer was divided in stripe form of a direction perpendicular to the stripe of said ITO film by a usual photolithography method using a photoresist. The substrate thus obtained was dried under reduced pressure and a glass plate for sealing was adhered using an epoxy based adhesive to obtain a display device. The display device was subject to sequential activation by applying voltage to both electrodes after processing at 80° C. for 250 hours, however, the display device emitted light without problem.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A positive-working photosensitive resin composition comprising an alkali soluble resin (A) which is a resin containing one or more structures selected from a polybenzoxazole structure, a polybenzoxazole precursor structure, a polyimide structure, a polyimide precursor structure, a polyamic ester structure, a diazoquinone compound (B) and a mixture solvent of two or more kinds (D), wherein the mixture solvent (D) contains γ-butyrolactone and propylene glycol monoalkyl ether and the total amount of γ-butyrolactone and propylene glycol monoalkyl ether is about 70 wt % or more of the total amount of solvent.

2. A positive-working photosensitive resin composition according to claim 1, wherein the mixture solvent (D) further contains a solvent having dipole moment of about 3.5 debye or more other than γ-butyrolactone and propylene glycol monoalkyl ether.

3. A positive-working photosensitive resin composition according to claim 1, wherein the propylene glycol monoalkyl ether is at least one member selected from the group consisting of propylene glycol monomethyl ether, propylene glycol monoethyl ether, propylene glycol monopropyl ether and propylene glycol monobutyl ether.

4. A positive-working photosensitive resin composition according to claim 2, wherein the solvent having dipole moment of about 3.5 debye or more is at least one member selected from the group consisting of N-methylpyrrolidone, dimethyl sulfoxide and sulfolane.

5. A positive-working photosensitive resin composition according to claim 1, wherein the alkali soluble resin (A) has a structure represented by the following formula (1):

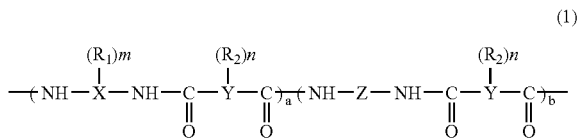

(1)

wherein, X is an organic group of 2 to 4 valences; Y is an organic group of 2 to 6 valences; $R_1$ is a hydroxyl group or —O—$R_3$ each of which may be the same or different from each other wherein m is an integer of 0 to 2; $R_2$ is a hydroxyl group, a carboxyl group, —O—$R_3$ or —COO—$R_3$ each of which may be the same or different from each other wherein n is an integer of 0 to 4; $R_3$ is an organic group having 1 to 15 carbon atoms; if $R_1$ is not a hydroxyl group, at least one of $R_2$ is a carboxyl group; if $R_2$ is not a carboxyl group, at least one of $R_1$ is a hydroxyl group); Z is

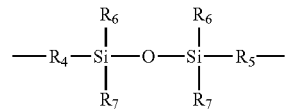

wherein each of $R_4$ and $R_5$ is a divalent organic group and each of $R_6$ and $R_7$ is a monovalent organic group each of which may be the same or different from each other; each of a and b represents a molar fraction; a+b=100% by mole, a=60 to 100% by mole and b=0 to 40% by mole.

6. A method for producing a pattern-formed resin film, comprising steps of:
forming a composition layer by coating the positive-working photosensitive resin composition according to claim 1 on a substrate;
forming a pattern by allowing the composition layer to be irradiated with an active energy ray and be in contact with a developing solution;
and heating the composition.

7. A semiconductor device produced by using the positive-working photosensitive resin composition according to claim 1.

8. A display device produced by using the positive-working photosensitive resin composition according to claim 1.

9. A method for producing a semiconductor device wherein the semiconductor device is obtained by applying the positive-working photosensitive resin composition according to claim 1 on a semiconductor element so that a film thickness of the positive-working photosensitive resin composition becomes about 0.1 to 50 μm after heating followed by prebaking, exposing, developing and heating.

10. A method for producing a display device wherein the display device is obtained by applying the positive-working photosensitive resin composition according to claim 1 on a substrate for display device so that a film thickness of the positive-working photosensitive resin composition becomes about 0.1 to 50 μm after heating followed by prebaking, exposing, developing and heating.

* * * * *